United States Patent
Lee et al.

(10) Patent No.: US 7,349,257 B2
(45) Date of Patent: Mar. 25, 2008

(54) COMBINATION NONVOLATILE MEMORY USING UNIFIED TECHNOLOGY WITH BYTE, PAGE AND BLOCK WRITE AND SIMULTANEOUS READ AND WRITE OPERATIONS

(75) Inventors: Peter W. Lee, Saratoga, CA (US); Fu-Chang Hsu, San Jose, CA (US); Hsing-Ya Tsao, San Jose, CA (US); Han-Rei Ma, Los Altos, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 11/633,334

(22) Filed: Dec. 4, 2006

(65) Prior Publication Data

US 2007/0133341 A1    Jun. 14, 2007

Related U.S. Application Data

(62) Division of application No. 11/011,306, filed on Dec. 14, 2004, now Pat. No. 7,154,783, which is a division of application No. 10/351,179, filed on Jan. 24, 2003, now Pat. No. 6,850,438.

(60) Provisional application No. 60/429,261, filed on Nov. 25, 2002, provisional application No. 60/426,614, filed on Nov. 14, 2002, provisional application No. 60/394,202, filed on Jul. 5, 2002.

(51) Int. Cl.
*G11C 11/34* (2006.01)

(52) U.S. Cl. .............................. 365/185.12; 365/185.23

(58) Field of Classification Search ............ 365/185.12, 365/185.23, 185.11, 185.29, 185.33
See application file for complete search history.

(56) References Cited

U.S. PATENT DOCUMENTS

| 5,267,196 A | * | 11/1993 | Talreja et al. ............ 365/185.11 |
| 5,748,538 A | | 5/1998 | Lee et al. |
| 5,812,452 A | * | 9/1998 | Hoang .................... 365/185.11 |

(Continued)

FOREIGN PATENT DOCUMENTS

WO    WO 02/052573 A1    7/2002

OTHER PUBLICATIONS

Co-pending U.S. Appl. No. 09/891,782, filed Jun. 27, 2001, "A Novel 3-Step Write Operation Nonvolatile Semiconductor One-Transistor Flash EEPROM Memory", Assigned to the Same Assignee as the Present Invention.

*Primary Examiner*—Anh Phung
(74) *Attorney, Agent, or Firm*—Saile Ackerman LLC; Stephen B. Ackerman

(57) ABSTRACT

A combination EEPROM and Flash memory is described containing cells in which the stacked gate transistor of the Flash cell is used in conjunction with a select transistor to form an EEPROM cell. The select transistor is made sufficiently small so as to allow the EEPROM cells to accommodate the bit line pitch of the Flash cell, which facilitates combining the two memories into memory banks containing both cells. The EEPROM cells are erased by byte while the Flash cells erased by block. The small select transistor has a small channel length and width, which is compensated by increasing gate voltages on the select transistor and precharge bitline during CHE program operation.

4 Claims, 29 Drawing Sheets

U.S. PATENT DOCUMENTS

| | | | |
|---|---|---|---|
| 5,999,451 A * | 12/1999 | Lin et al. ............... 365/185.11 |
| 6,174,759 B1 | 1/2001 | Verhaar et al. |
| 6,212,102 B1 | 4/2001 | Georgakos et al. |
| 6,243,298 B1 | 6/2001 | Lee et al. |
| 6,252,799 B1 | 6/2001 | Liu et al. |
| 6,266,274 B1 | 7/2001 | Pockrandt et al. |
| 6,307,781 B1 | 10/2001 | Shum |
| 6,326,661 B1 | 12/2001 | Dormans et al. |
| 6,370,081 B1 | 4/2002 | Sakui et al. |
| 6,400,604 B2 | 6/2002 | Noda |
| 6,501,684 B1 | 12/2002 | Park et al. |
| 6,556,481 B1 | 4/2003 | Hsu et al. |
| 6,950,336 B2 * | 9/2005 | Sowards et al. ....... 365/185.12 |
| 2002/0089878 A1 | 7/2002 | Park et al. |
| 2003/0161184 A1 | 8/2003 | Lee et al. |
| 2004/0027856 A1 | 2/2004 | Lee et al. |

* cited by examiner

| Node | Program 1 | Program 2 | Program 3 | Program 4 | program 5 |
|---|---|---|---|---|---|
| BL | +6V | +6V | +6V | +6V | +6V |
| SG1 | +18V | +18V | +18V | +18V | +18V |
| M1a-M1b Precharge | N/A | N/A | N/A | N/A | N/A |
| WL1 | +10V | +10V | +10V | +10V | +10V |
| SL1 | 0V | 0V | 0V | 0V | 0V |
| WL2 | 0V | 0V | -3V | 0V | 0V |
| M2a-M2b Precharge | None | +2V | +2V | +2V | +2V |
| SG2 | 0V | 0V | 0V | 0V | 0V |
| SG3 | 0V | 0V | 0V | 0V | 0V |
| M3a-M3b Precharge | None | +2V | +2V | +2V | +2V |
| WL3 | 0V | 0V | -3V | 0V | 0V |
| SL2 | 0V | 0V | 0V | FL | +2V |
| WL4 | 0V | 0V | -3V | 0V | 0V |
| M4a-M4b Precharge | None | +2V | +2V | +2V | +2V |
| SG4 | 0V | 0V | 0V | 0V | 0V |

FIG. 2C

COMBINATION NONVOLATILE MEMORY USING UNIFIED TECHNOLOGY WITH BYTE, PAGE AND BLOCK WRITE AND SIMULTANEOUS READ AND WRITE OPERATIONS

This application is a Divisional application of U.S. Ser. No. 11/011,306, filed on Dec. 14, 2004 now U.S. Pat. No. 7,154,783 (AP02-009D), which is a divisional application of U.S. Ser. No. 10/351,179 filed on Jan. 24, 2003, now issued as U.S. Pat. No. 6,850,438 (AP 02-009), which claims benefit of priority of the filing date to: 1) U.S. Provisional Application No. 60/394,202, filed on Jul. 5, 2002 and is incorporated herein by reference; 2) U.S. Provisional Application No. 60/426,614, filed on Nov. 14, 2002 and is incorporated herein by reference; and 3) U.S. Provisional Application No. 60/429,261, filed on Nov. 25, 2002 and is incorporated herein by reference.

RELATED PATENT APPLICATIONS

U.S. patent application Ser. No. 09/852,247 to F. C. Hsu et al filed on May 9, 2001 and assigned to the same assignee as the present invention.

U.S. patent application Ser. No. 09/891,782 to F. C. Hsu et al filed on Jun. 27, 2001 and assigned to the same assignee as the present invention.

BACKGROUND OF THE INVENTION

1. Field of Invention

The present invention relates to a semiconductor memory and in particular a combinational nonvolatile memory utilizing both one-transistor Flash and two-transistor EEPROM memory made from the same technology and providing simultaneous read and write operations.

2. Description of Related Art

Many electronic applications require writing data into the memory while at the same time reading program code from the memory, and many systems utilize both block-erasable Flash memory and byte-erasable EEPROM to perform this dual function. The block-erasable Flash memory stores program codes having less frequent update rates, and the byte-erasable EEPROM stores the data and parameters with a high update frequency rate with self-timed Write control. This allows data to be written to the EEPROM while the program code is read from the Flash memory simultaneously.

Since the data and parameters stored in the system needs to be frequently updated in small units of a byte or a page, the data is preferred to be stored in a byte-erasable EEPROM. Using an EEPROM to store both the program code and data is not very cost effective because of the large cell size of the EEPROM. Using Flash memory to store both the program code and data is not easy because Flash memory lacks the byte-level data alterability as provided in an EEPROM. Flash memory erases a large block size of data, 64K×8, at one time because of the Flash memory array architecture. It is very difficult to perform byte-level data update with this block erase feature; therefore, there is a software solution that is proposed to emulate the byte-erasable EEPROM with the architecture of block-erasable Flash memory. As a result, a highly complex software technique is required which causes drastic system performance degradation, and sometimes may cause reliability problem.

The integration of a Flash and EEPROM memory in a single memory chip is highly desirable for reducing cost, device footprint, and power consumptions while providing superior performance; however, since the cell structure and process technology is different between Flash and EEPROM memories, combining these two memories into one chip requires very complex process flow, which is not cost effective.

In U.S. Pat. No. 6,370,081 (Sakui, et al.) a nonvolatile memory cell is directed to having a memory cell and two select transistors sandwiching the memory cell. One block of memory nonvolatile memory cells has one control gate line. The nonvolatile memory cells connected to one control gate line form one page. A sense amplifier having a latch function is connected to a bit line. In a data change operation, data of memory cells of one page are read to the sense amplifiers. After the data is sensed and stored in the sense amplifiers a page erase is performed. The data from the sense amplifiers are programmed in the memory cells of one page. Data in the sense amplifiers maybe changed in the sense amplifiers prior to the reprogramming to allow byte or page data programming.

U.S. Pat. No. 6,400,604 (Noda) is directed to a nonvolatile semiconductor memory device having a data reprogram mode. The memory has a memory cell array, a page buffer for storing one page data to be programmed to memory cells, which are selected in accordance with a page address signal. The memory further has an internal column address generating circuit for generating column addresses of the one page with inputting the page address signal in order to transfer the one data stored in the page buffer to the memory cells, a column decoder receiving the column addresses from the internal column address generating circuit, and a control circuit having a data reprogram mode. The data reprogram mode erases one page data stored in the memory cells, which are selected in accordance with the page address signal and programs the one page data stored in the page buffer to the memory cells which are selected.

U.S. Pat. No. 6,307,781 (Shum) is directed to providing a two transistor cell NOR architecture flash memory. The floating gate transistor is placed between the selection transistor and an associated bit line as shown in FIGS. 2a-c. The flash memory is deposited within a triple well and operates according to a Fowler-Nordheim tunnel mechanism. Programming of memory cells involves tunneling of carriers through gate oxide from a channel region to a floating gate rather than tunneling from a drain or source region to the floating gate.

U.S. Pat. No. 6,212,102 (Georgakos, et al.) is directed to illustrating an EEPROM with two-transistor memory cells with source-side selection. The voltage required to program a memory cell is delivered via a source line.

U.S. Pat. No. 6,266,274 (Pockrandt, et al.) is directed to a non-volatile two-transistor memory cell which has an N-channel selection transistor and an N-channel memory transistor. The drive circuitry for the cell includes a P-channel transfer transistor. A transfer channel is connected to a row line leading to the memory cell.

U.S. Pat. No. 6,174,759 (Verhaar, et al.) directed to an EEPROM cell that is provided with such a high-voltage transistor as a selection transistor similar to that described in FIGS. 2a-c. Apart from the n-well implantation, high-voltage transistors of the p-channel are largely manufactured by means of the same process steps as the p-channel transistors in the logic, so that the number of process steps remains limited.

U.S. Pat. No. 6,326,661 (Dormans, et al) is directed to a floating gate memory cell having a large capacitive coupling between the control gate and the floating gate. The control gate is capacitive coupled to the substantially flat surface portion of the floating gate and to at least the side-wall portions of the floating gate facing the source and the drain, and ends above the substantially flat surface portion of the select gate. These measures provide a semiconductor device having a large capacitive coupling between the control gate and the floating gate of the memory cell thus increasing the coupling ratio.

U.S. Pat. No. 5,748,538 (Lee, et al.), assigned to the same assignee as the present invention, describes an OR-plane memory cell array for flash memory with bit-based write capability. The memory cell array of a flash electrically erasable programmable read only memory (EEPROM) includes nonvolatile memory cells arranged in rows and columns. The sources of nonvolatile memory cells in the same memory block are connected to a main source line through a control gate. Similarly, the drains of the nonvolatile memory cells of the same memory block are connected to a main bit line. The separate source and drains in the column direction are designed for a bit-based write capability. Writing, such as erasing or programming, of a selected nonvolatile memory cell uses the Fowler-Nordheim tunneling method and can be accomplished due to the programming or erase inhibit voltage that is applied to non-selected nonvolatile memory cells.

SUMMARY OF THE INVENTION

It is an objective of the present invention to provide a non-volatile memory technology, cell structure, array architecture, and operations that allows using a single technology to manufacture both Flash memory array and EEPROM array in one chip.

It is another objective of the present invention to form a two-transistor EEPROM cell from a combination of the stacked gate of the Flash memory cell and a select transistor.

It is also another objective of the present invention to provide a two-transistor EEPROM cell that has a footprint sufficiently small to be compatible with the bit line pitch of the Flash memory array.

It is yet another objective of the present invention to bias the gate of the select transistor of the EEPROM cell during CHE (Channel Hot Electron) program operation with a voltage that is sufficiently high to allow a sufficiently small select transistor to allow an EEPROM cell footprint that is compatible with the bit line pitch of the Flash memory array.

It is still another objective of the present invention to organize EEPROM memory cells into bytes within pages, wherein each byte has eight two-transistor EEPROM cells with a common word line WL, select gate SG, source line SL, and eight bit lines BL.

It is still yet another objective of the present invention to organized EEPROM memory array into either horizontal or vertical pages.

It is also yet another objective of the present invention to provide a byte-word line decoder that selects EEPROM memory cells organized by byte and in either horizontal or vertical pages or a page of random selection order.

It is also still another objective of the present invention to organize a one-transistor Flash memory array by block with a divided bit line device smaller than a traditional device, wherein the divided bit line device is a N-channel device that can be made the same as or little larger than the select transistor of the two-transistor EEPROM of the present invention.

It is also still another objective of the present invention to employ the same CHE program and FN channel-erase schemes for the one-transistor Flash cell and the two-transistor EEPROM cell.

It is yet also another objective of the present invention to organize the EEPOM memory cells and the Flash memory cells connected to a common bit line within the same column address space.

It is further an objective of the present invention to organize the EEPROM cells into a plurality of arrays in which each array contains a byte-word line decoder and in which the plurality of arrays share the bit line of the same column addressable space.

It is still further an objective of the present invention to provide simultaneous read and write operations between EEPROM and Flash arrays where the EEPROM array allows a byte, page and chip write and the Flash memory array allows block and chip write.

In the present invention a unified technology is created from which an EEPROM memory cell has evolved that incorporates the non-volatile storage element of a Flash memory cell into the EEPROM cell. The EEPROM cell also contains a select transistor, which has been sized to allow the EEPROM to be compatible with the bit line pitch of the Flash memory cell. This is accomplished by reducing the size of the select transistor which is a result of using a higher than normal program voltage on the gate of the select transistor. Pre-charging the node connecting the nonvolatile storage element and the select transistor of the EEPROM cell, or providing a virtual-ground scheme of each byte, prevents a select transistor break down. The precharge voltage or virtual-ground source "bucks" the high bit line voltage connected to non-selected cells in a selected column so that the Vds of the select transistor can be made smaller than the Vds of floating-gate cell. Thus, a shorter channel length of the select transistor can be made smaller than or equal to the channel length of the floating-gate device as required in CHE program operation.

By making the EEPROM cell compatible with the bit line pitch of the Flash memory array, an EEPROM array, or a number of EEPROM arrays, can be combined with the Flash memory array such that both share the bit line address space. The EEPROM memory array is comprised of byte addressable elements within a page. The page can be either oriented horizontally in the direction of word lines or vertically in the direction of bit lines or a page of bytes in random bit line and byte-word line.

A plurality of EEPROM memory arrays, each containing a byte-word line decoder, can be organized together sharing bit line address space with and with out a Flash memory array sharing the same bit line address space within a memory bank. Bank multiplexers connect addresses and data to a plurality of memory banks and allow simultaneous read and write, read and read, write and write to be performed between memory arrays in the different memory banks. Thus reading of a Flash memory array can be performed simultaneous to writing to an EEPROM memory array and visa versa. Also simultaneous operations can be performed on a plurality of Flash memory arrays or a plurality of EEPROM memory arrays.

BRIEF DESCRIPTION OF THE DRAWINGS

This invention will be described with reference to the accompanying drawings, wherein:

FIG. 2C shows a table of voltages of the present invention for various programming strategies of the two-transistor EEPROM memory cells shown in FIGS. 2A and 2B.

DETAILED DESCRIPTION OF THE PREFERRED EMBODIMENT

Figure 1A:
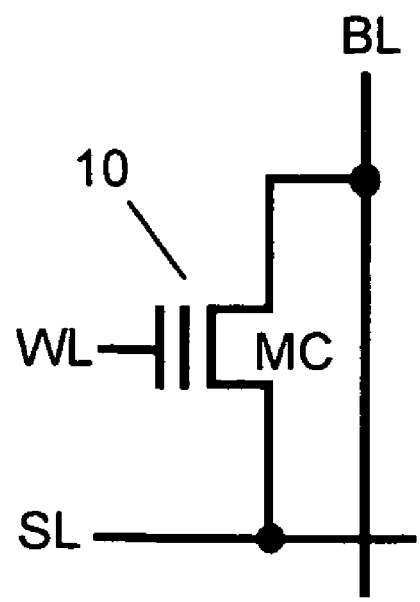
FIG. 1A shows a schematic diagram of a one-transistor Flash memory cell of the present invention.

In FIG. 1A is shown a schematic diagram of the Flash memory cell MC of the present invention. The stacked gate transistor 10, which forms the memory cell, has a source diffusion connected to a source line SL and a drain diffusion connected to a bit line BL. The control gate of the stacked gate transistor is connected to a word line WL. The Flash cell of the present invention can be made smaller by reducing coupling ratio from Poly2 to floating-gate and by increasing word line voltage to maintain the same program gate voltages. The erase and program conditions of Flash are listed in Table 1 below.

TABLE 1

| Voltage | BL | WL | SL | Bulk | Scheme |
|---------|-----|-------|----|------|-------------|
| Erase   | 0   | −18 V | 0  | 0    | FN (Channel) |
| Program | +5 V | +10 V | 0 | 0    | CHE         |

Figure 1B:
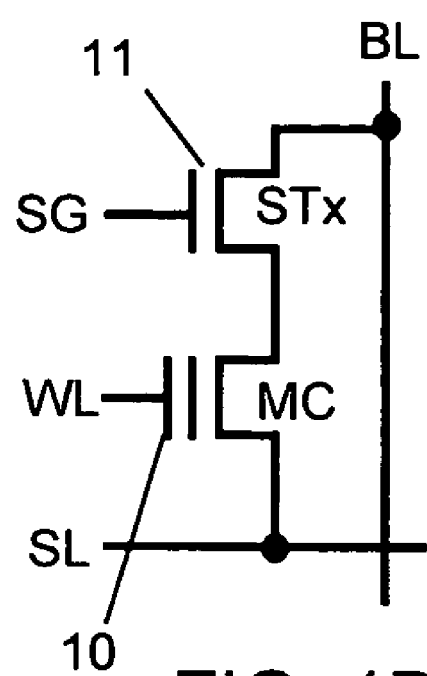
FIG. 1B shows a schematic diagram of a two-transistor EEPROM memory cell of the present invention.

Shown in FIG. 1B is shown a schematic diagram of a two transistor EEPROM memory cell of the present invention. The Flash and EEPROM memory cells are fully described in Provisional Application Ser. No. 60/426,614 noted above which is herein included by reference. The stacked gate transistor 10 used in the Flash memory cell MC is connected in series with a select transistor 11 STx. The drain diffusion of the select transistor STx is connected to the bit line BL, and the source diffusion of the stacked gate transistor 10 is connected to a source line SL. The control gate of the stacked gate transistor 10 is connected to a word line WL while the gate of the select transistor 11 is connected to a select gate line SG for the EEPROM memory cell. Using the Flash memory cell MC coupled with a small select transistor STx allows the EEPROM cell to be able to use bit lines on the same pitch as the Flash memory cell MC and facilitates the combining of the Flash and EEPROM memory arrays into a chip using the same vertical address space provided by the bit lines. The select transistor is compensated for the small size by increasing the voltage of the select gate SG. The select transistor, which has a channel length shorter than or equal to the channel length of the stack-gate cell, allows adequate current flow to facilitate programming the memory cell MC by channel hot electrons (CHE). In the present invention, approximately 6V BL voltage is used for the EEPROM cell, which is higher than the 5V that is required for the drain of the Flash cell, ensures the voltage drop across STX because the high-current CHE program is less than 1V. The erase and program conditions of EEPROM are listed in the Table 2 below.

TABLE 2

| Voltage | BL | WL | SL | SG | Bulk | Scheme |
|---|---|---|---|---|---|---|
| Erase | 0 | −18 V | 0 | +3 V | 0 | FN (Channel) |
| Program | +6 V | +10 V | 0 | +18 V | 0 | CHE |

Figure 2A:
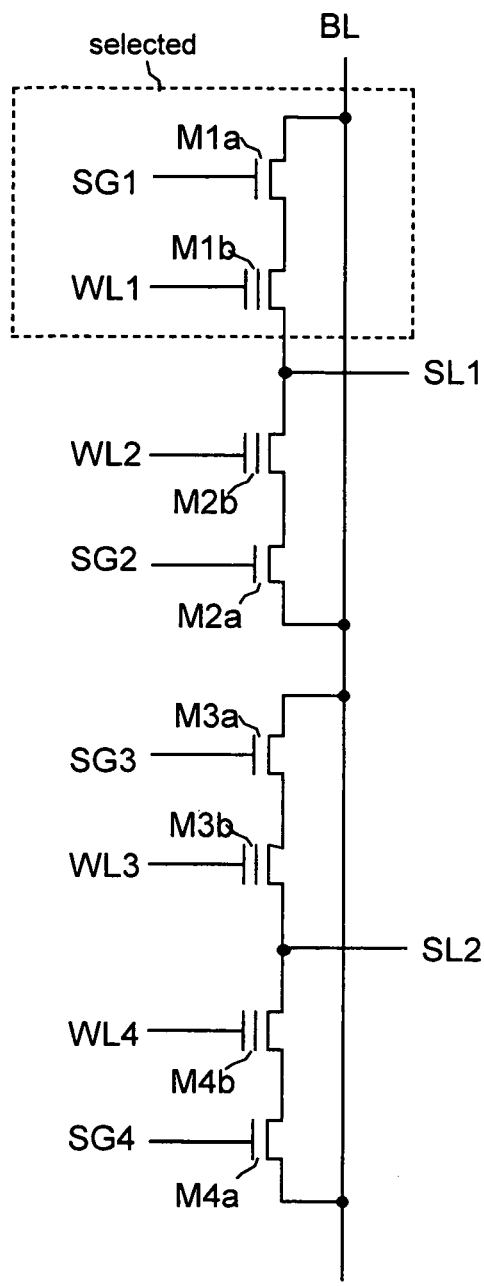
FIGS. 2A and 2B show schematic diagrams of the present invention of two-transistor EEPROM memory cell connections along a portion of a bit line, wherein two adjacent cells share one common source line in FIG. 2A but have separate source lines for FIG. 2B.
Figure 2B:
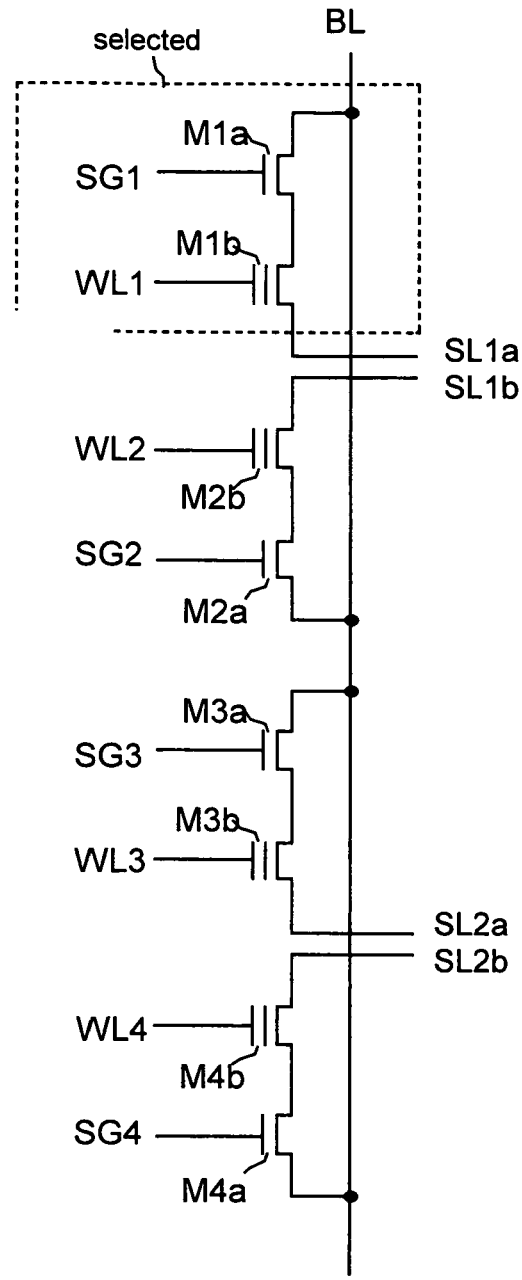

In FIGS. 2A and 2B are shown the EEPROM cells of the present invention connected along a portion of a bit line BL. The EEPROM cells each contain a select transistor M1a, M2a, M3a and M4a and a stacked gate transistor M1b, M2b, M3b and M4b. The gates of the select transistors are connected to select gate lines SG1, SG2, SG3 and SG4, and the gates of the stacked gate transistors are connected to word lines WL1, WL2, WE3 and WL4. In each cell the drain of the select transistor M1a, M2a, M3a and M4a is connected to the bit line BL, the source of the stacked gate transistors M1b and M2b are connected to the source line SL1, and the source of the stacked gate transistors M3b and M4b are connected to the source line SL2. Thus the cells in FIG. 2A are connected in pairs to a source line. The cell containing select transistor M1a and stacked gate transistor M1b is designated as the selected cell, for which will be shown programming voltages in the table in FIG. 2C. The configuration in FIG. 2B is different than FIG. 2A in that the adjacent cells have separated source lines SL1a and SL1b, and SL2a and SL2b. The separated source lines allow independent source line voltages to be applies to adjacent memory cells in a column. This allows the source line of a byte width of selected cells to be connected to ground while the source line of the unselected cells are floated as shown in the FIG. 2C under Program 4 conditions. Both FIG. 2A and FIG. 2B only show one bit line of a selected byte of EEPROM cell array of the present invention.

In FIG. 2C is shown voltages for different programming schemes for the configuration shown in FIG. 2A. The voltages shown are examples and do not necessarily represent actual value. For the first programming scheme, Program 1, the bit line BL is coupled to approximately +6V and the source lines SL1 and SL2 are connected to zero volts. For the selected cell the select gate SG1 is coupled to approximately +18V and the word line WL1 is coupled to approximately +10V. All other word lines WL2, WL3, WL4 and select gates SG2, SG3 and SG4, and the source line SL2 are coupled to zero volts to inhibit the non-selected cells from programming disturb. In order to avoid any current leakage through non-selected EEPROM cells such as M2a, M3a and M4a in a program operation, all threshold voltages Vt of the EEPROM cell are designed to be positive and the gates on word lines WL2-WL4 are grounded without a pre-charge bit line in Program 1 operation. The advantage of Program 1 is the simple EEPROM cell array. The penalty is the complicated implementation of circuit and control flow to correct the Vt of negative cells back to a positive voltage which involves a very long time and power consumption after erase operation.

The conditions for positive Vt cells in Program 2 are designed to be the same as Program 1 except a 2V pre-charge is required for the selected bit lines prior to program operation. The bit line pre-charge can remove any punch-through of the select transistor STx for better reliability.

For Program 3, Program 4 and Program 5, the Vt of EEPROM cells are allowed to be either positive or negative but a bit line pre-charge is required prior to program operation. In Program 3, a negative voltage of −3V is applied to all non-selected word lies of WL2, WL3 and WL4 to shut off the bit line leakage through select transistors STx of M2a, M3a and M4a due to punch-through and possible negative Vt cells of M2b, M3b and M4b before pre-charge to the selected bit lines. Program 5 differs from Program 3 by applying a ground voltage to the non-selected word lines with the source line back biased at 2V to shut off the bit line leakage through the possible negative Vt cells of M2b, M3b and M4b assuming the Vt is not below −2V. The selected SL1 is still biased at ground for appropriate CHE programming for the selected cell M1b. The penalty of Program 4 is that a source line decoder is required to distinguish the source line voltage between the selected and non-selected source lines. Program 4 is a preferred scheme of the present invention to avoid the complexity of bit line pre-charge and the overhead of a source line decoder by floating the non-selected source lines and grounding the selected source line through a transistor gated by a select gate signal.

Continuing to refer to FIG. 2C, since the select gate transistor STx of the EEPROM cell is intended to be made small to be able to fit into a small footprint that can accommodate the bit line pitch of a Flash stacked gate cell similar to the stacked gate transistor M1b, M2b, M3b and M4b, the channel length is made short to achieve a small channel width. However, the select gate transistor is at risk for bit line leakage due to a gate aid break down through the non-selected transistors of M2a, M3a and M4a resulting from the application of +6V on the selected bit line BL during CHE program operation. To overcome this break down risk, a precharge voltage is created on the source diffusion of the select transistors M2a, M3a and M4a of approximately +2V. This is achieved by applying more than 3V to SG1-SG4 with bit line BL at 2V, WL1-WL4 grounded, and SL1-SL2 grounded for Program 3, Program 4 and Program 5 for Vt of cells allowed to be negative. In Program 1 and Program 2, if the Vt of the cell is negative and gate of the cell is grounded, the cell still conducts a leakage current when STx has a punch-through during CHE program operation. Note, even when the gate of the cell is at ground level the leakage cannot be shut off if the Vt of the cell is negative. Only when the Vt of the cell is positive is the leakage prevented with a grounded gate. One possible way to shut off leakage, when the Vt of the cell is negative and gate is at ground level, is floating the source of the cell.

The precharge bit line voltage reduces the Vds of the select transistors STx to a value around 4V due to the difference between 6V drain and 2V source. This 4V Vds is below the Vds 5V of the stack-gate cells of M1b, M2b, M3b and M4b. As a result, the channel length of Mna (M1a, M2a, M3a and M4a) can be made smaller than or equal to cells of Mnb (M1b, M2b, M3b and M4b.

To precharge a cell the bit line BL is coupled to a voltage approximately equal to the desired precharge voltage. Then the select gates SG2, SG3 and SG4 of the non-selected cells are coupled with a voltage higher than the desired precharge voltage plus one Vt. After a short period of time, approximately 100 ns, the voltage of the select gates SG2, SG3 and SG4 are returned to zero volts trapping the precharge voltage on the source of the select transistors when cells of M1b-M4b are biased in a non-conduction state.

Figure 3A:
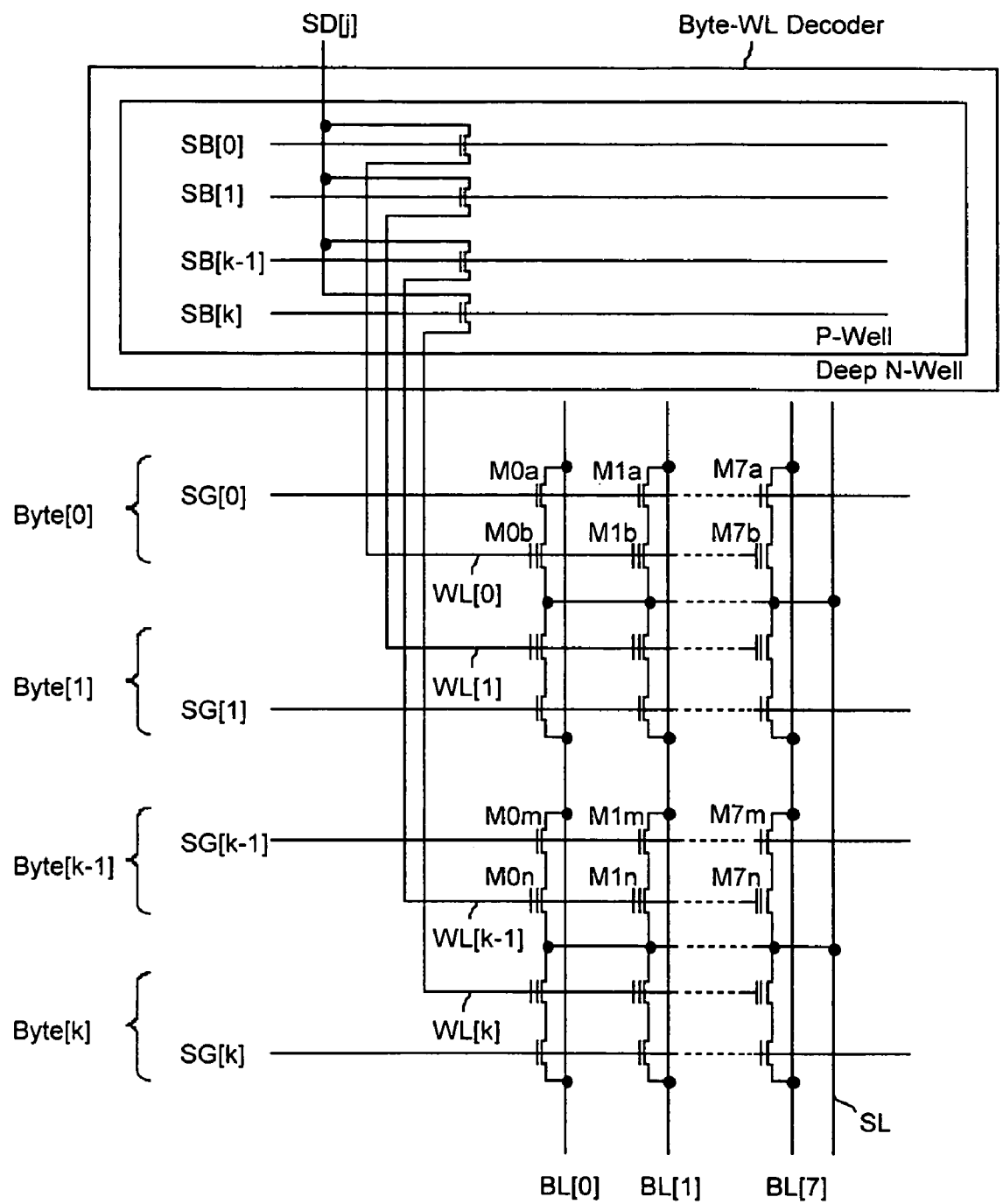
FIG. 3A shows a schematic diagram of the present invention for a portion of a two transistor EEPROM memory array with a Byte-word line decoder and a common source line for a byte wide column of memory cells.

In FIG. 3A is shown a portion of a byte-erasable EEPROM memory array of the present invention divided into a plurality of byte-units Byte(0) to Byte(k). The word lines WL(0) to WL(k) of each byte-unit are connected to metal lines running vertically along the direction of the bit lines (Y-direction), and connected to the Byte-word line decoder located on the top of the array. The bytes Byte(0) to Byte(k) form a page from which a plurality of pages can be placed along the X-direction to form any density of EEPROM array. It should be noted that since the Byte-word line decoder can select any random one of multiple word lines to perform read, erase, or program operations, the array has a true byte-erasable capability. The array of FIG. 3A is a full-featured FLOTOX-type EEPROM array replacement in which all the source lines of the bytes Byte(0) to Byte(k) in one page are connected together to a vertical metal source line (SL). Therefore, during program operation, all the source lines will be applied with the same voltage.

Continuing to refer to FIG. 3A, the Byte-word line decoder (Byte-WL Decoder) is located within a P-well inside a deep N-well. A word line select voltage SD(j) is gated by the decoder to the selected word line WL(0) to WL(k) by decoder signals SB(0) to SB(k). The word line WL(0) connects to the control gates of the storage transistors M0b to M7b of Byte(0) and is selected by decoder signal SB(0). Similarly, the word line WL(k-1) connects to the control gates of the storage transistors M0n to M7n of Byte(k-1) and is selected by decoder signal SB(k-1). A select gate signal SG(0) selects bit lines BL(0) to BL(7) to be connected to the storage transistors through the select transistors M0a to M7a. Similarly, a select gate signal SG(k-1) selects bit lines BL(0) to BL(7) to be connected to the storage transistors through the select transistors M0m to M7m.

Figure 3B:
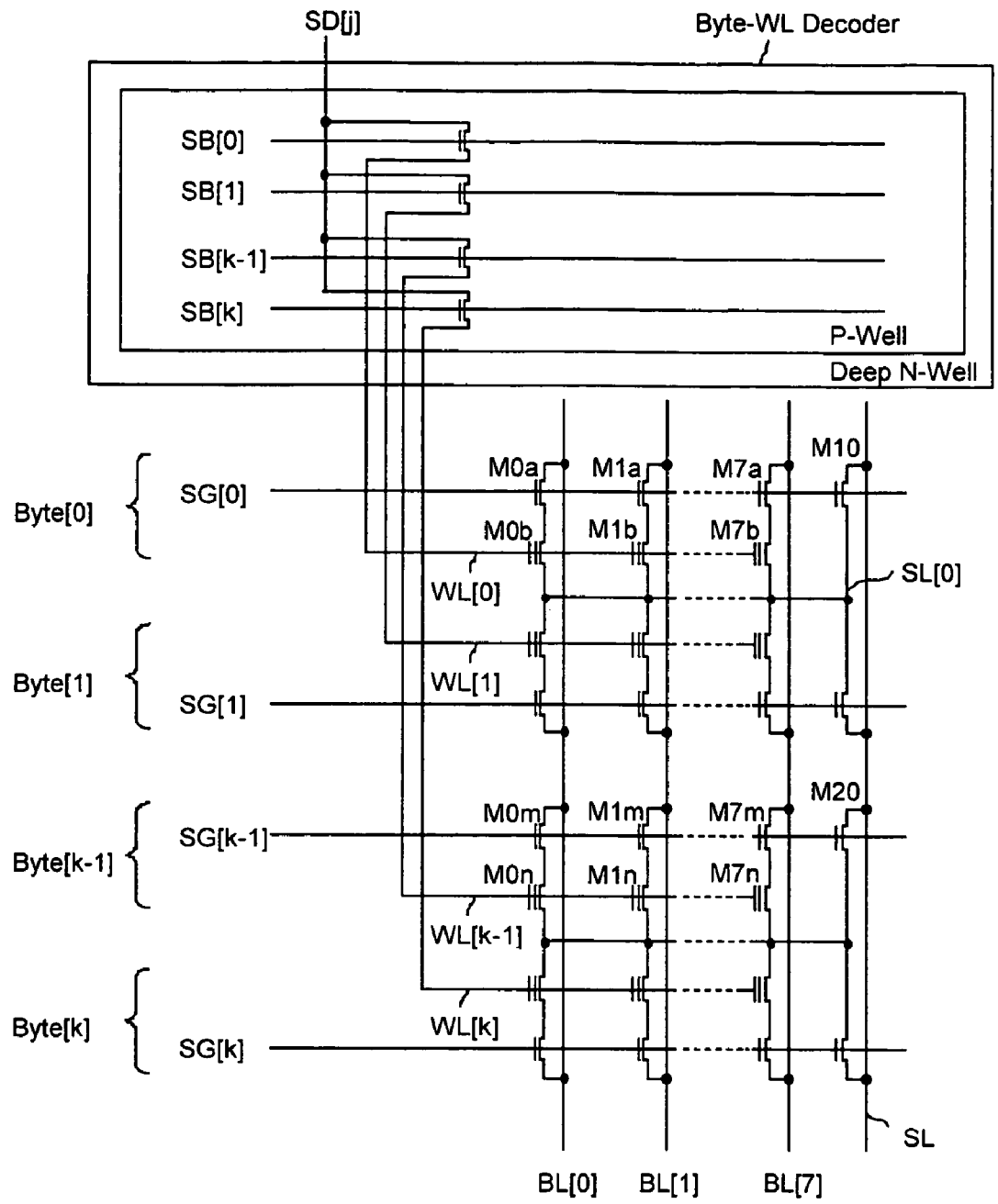
FIG. 3B shows a schematic diagram of the present invention for a portion of a two transistor EEPROM memory array with a Byte-word line decoder and a source line structure common between adjacent bytes.

In FIG. 3B is shown a second preferred byte-erasable EEPROM array that is divided into a plurality of byte-units Byte(0) to (k). In this embodiment there is a separated source lines structure in which each two adjacent bytes share one source line SL(0) to save layout area. Each source line SL(0) is separated from other source lines and is decoded by extra transistors. Otherwise, all the other array structure, including the word line partition and byte-word line decoder, are remained the same as the previous embodiment.

Continuing to refer to FIG. 3B, an extra source line SL running in the bit line direction is added to facilitate the decode and control of the source line of each byte. The source SL(0) of each byte is coupled to the source line SL through the source line select transistor typified by M10 and M20. The gate of the source line select transistor is connected to proper decoding signals, for example, the select gate signal of each byte SG(0) to SG(k). When programming a selected byte, the select gate signal of that byte will be applied with a high voltage, such as +18V for example, to turn on the select transistors on each bit line of the byte, which will also turns on the source line select transistor. This allows the source line of the selected byte to be connected to the vertical metal source line SL that provides 0V to the selected source line for CHE programming. Since all the select gates SG(0) to SG(k) of the deselected cells are applied with 0V to turn off the select transistors of the deselected bytes, it will also turn off the source line select transistors of the deselected bytes. This causes the source lines of the deselected bytes to be floated and allows this embodiment to realize the preferred bias condition shown in FIG. 2C for Program 4.

Figure 3C:
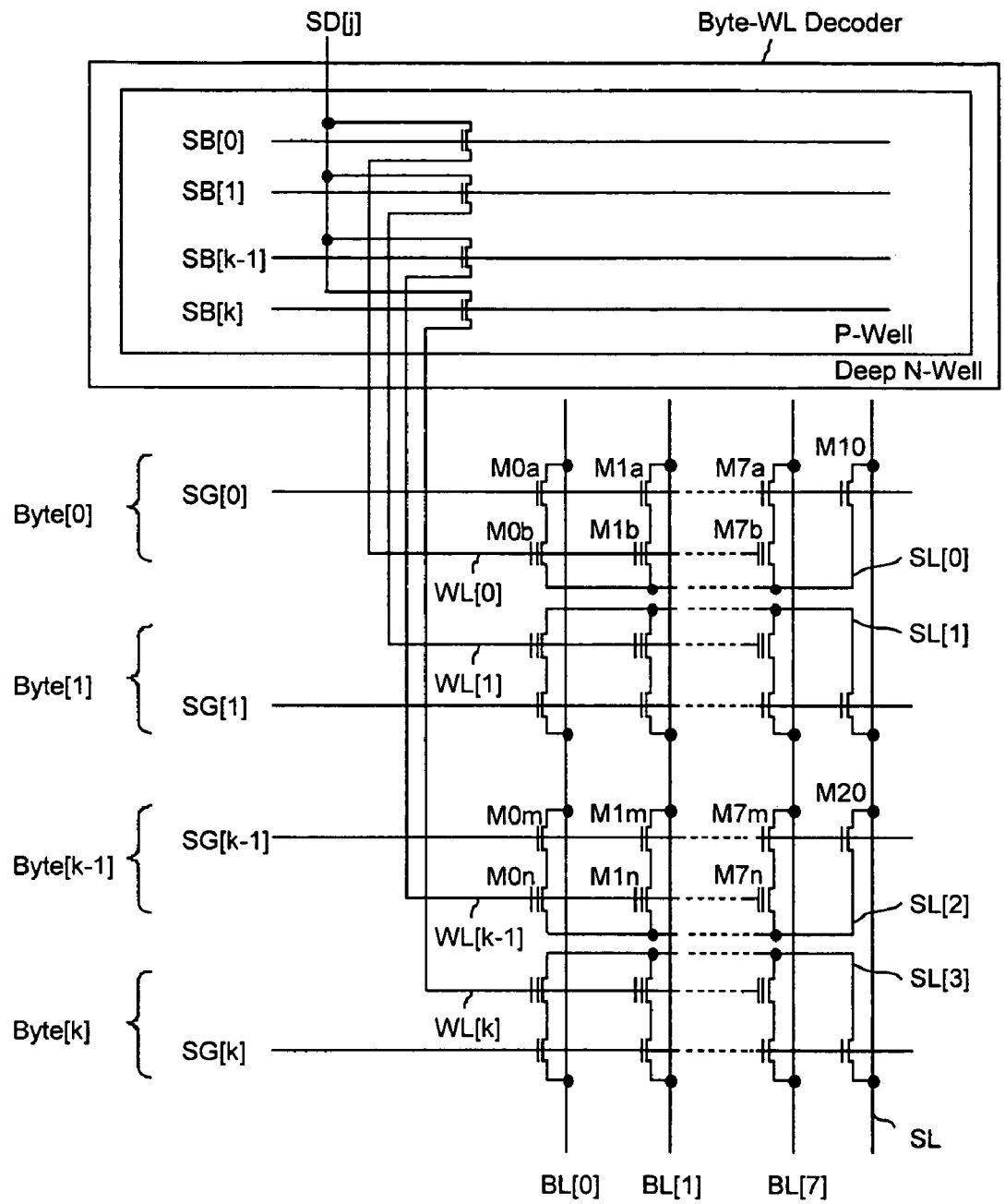
FIG. 3C shows a schematic diagram of the present invention for a portion of a two transistor EEPROM memory array with a Byte-word line decoder and with a separated source line structure.

In FIG. 3C shows another preferred byte-erasable EEPROM array that is divided into a plurality of byte-units Byte(0) to Byte(k). This embodiment has separated source lines; therefore, each byte in the array has its own individual source line. This provides a fully separated source line structure which allows the voltage of the source lines for each byte to be applied with preferred bias conditions independently. Otherwise, all the other array structure, including the word line partition and byte-word line decoder, remain the same as the previous embodiment. For example, the source SL(0) to SL(3) of each byte is coupled to the source line SL through the source line select transistor typified by M10 and M20. The gate of the source line select transistor is connected to proper select gate decoding signals SG(0) to SG(k). When programming a selected byte, the select gate signal SG(0) to SG(k) of the selected byte will be applied with a high voltage, such as +18V, for example, to turn on the select transistors on each bit lines of the byte. Meanwhile, this voltage will also turn on the source line select transistor connected to the select gate signal, M10 and M20. This allows the source line of the selected byte to be connected to the vertical metal source line SL that provides 0V to the selected source line for CHE programming. Since all the select gates of the deselected cell are applied with 0V to turn off the select transistors M0m to M7m of the deselected bytes, it will also turn off the source lines of select transistors of the deselected bytes. This causes the source lines of the deselected bytes to be floated, and allows this embodiment to realize the preferred bias condition as shown in FIG. 2C under the Program 4 mode.

Figure 4A:
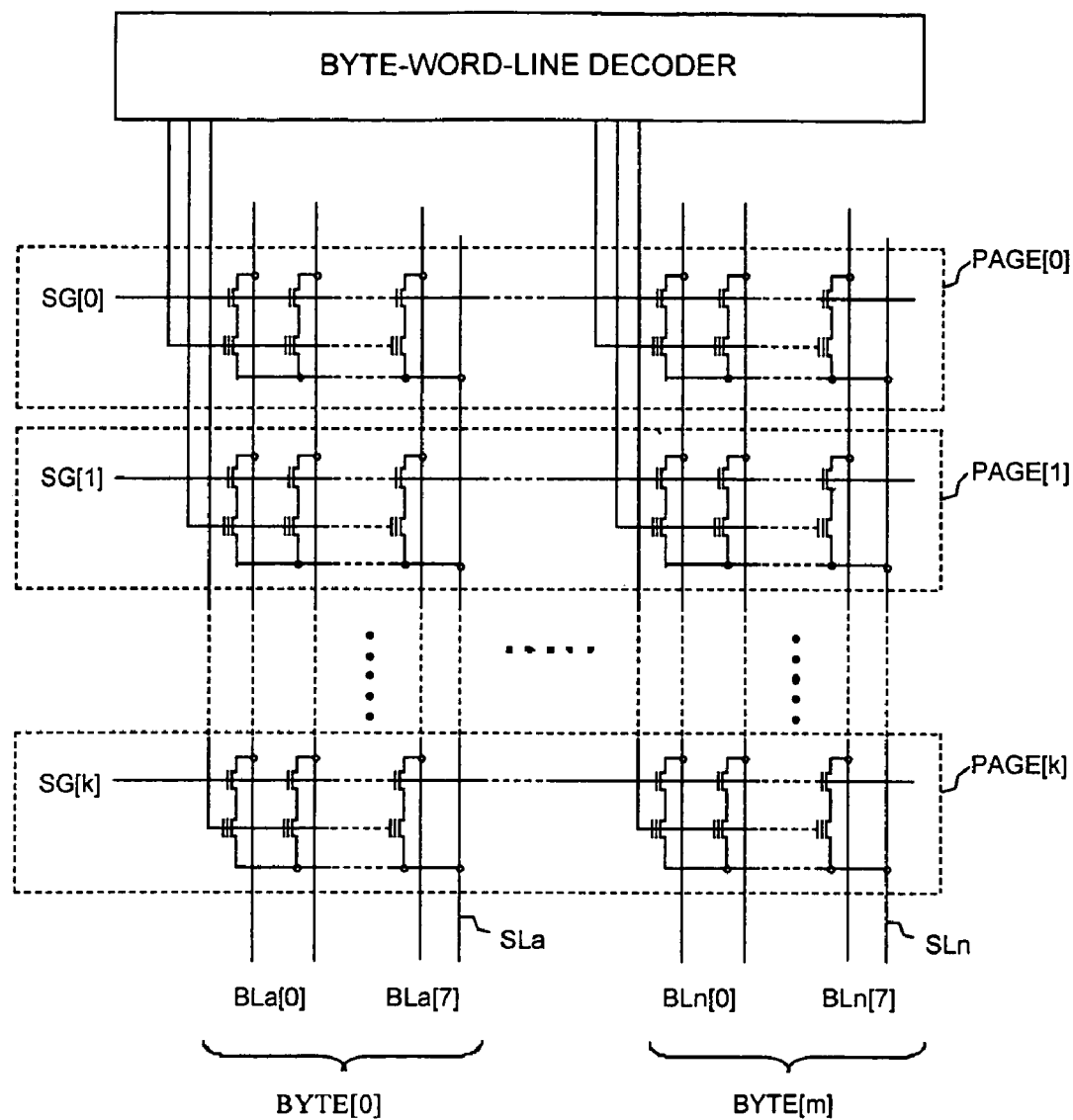
FIG. 4A shows a schematic diagram of the present invention for a portion of a two-transistor EEPROM memory array with Byte-word line-decoder and utilizing horizontal write pages.

In FIG. 4A is shown a portion of a two-transistor EEPROM memory array of the present invention based on Program 1 and Program 2 operations. The array is organized into horizontal pages, PAGE(0), PAGE(1) to PAGE(k). A byte-word line decoder selects the EEPROM cells in byte segments in each page. The select gate lines SG(0), SG(1), to SG(k) select all the select gates of the EEPROM cells in a page and the bit lines BLa(0)-BLa(7) to BLn(0)-BLn(7) connect to all cells in a column in the memory array. A vertical source line SLa to SLn connect to the source lines in each byte wide column of cells. Any number of bytes in a selected horizontal page can be selected for writing with a self-timed control.

Figure 4B:
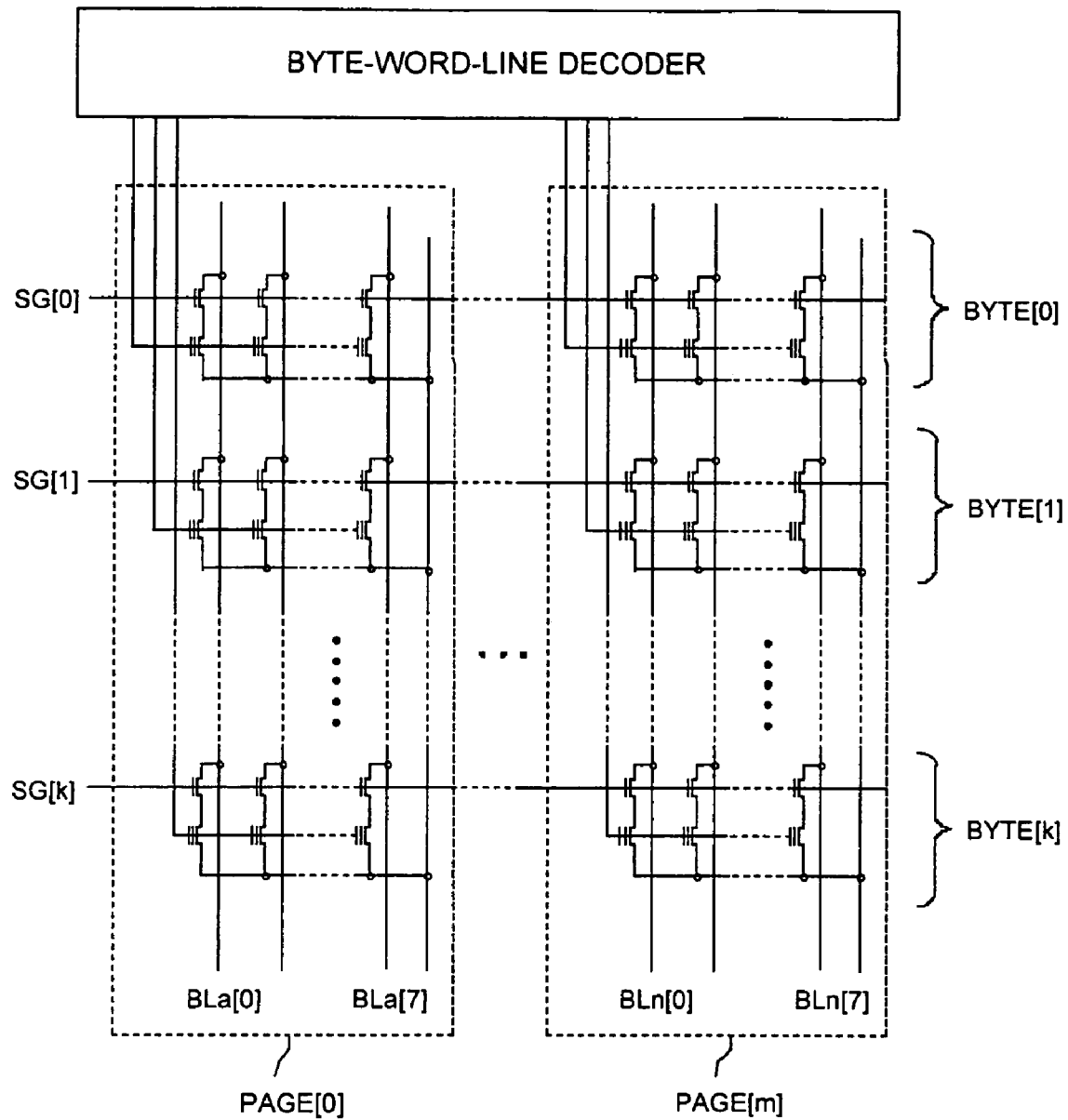
FIG. 4B shows a schematic diagram of the present invention for a portion of an EEPROM memory array with Byte-word line-decoder and utilizing vertical write pages.

In FIG. 4B is shown a portion of an EEPROM memory array of the present invention organized with vertical pages, PAGE(0) to PAGE(m), that are oriented in the direction of the bit lines. Within each page is a column of a byte wide collection of cells based on Program 1 and Program 2 operations. Each byte wide collection of cells is coupled with eight bit lines BLa(0)-BLa(7) to BLn(0)-BLn(7). The byte word line decoder selects a byte wide collection of cells with in a page and the select gate lines SG(0)-SG(k) couple to byte wide collection of cells between the vertical pages. Any number of bytes in a selected vertical page can be selected for writing with a self-timed control.

Unlike FIG. 3, in FIG. 4 is shown a portion of an EEPROM memory array of the present invention organized with vertical pages with a feature of virtual-ground source lines coupled to a byte wide collection of cells between the vertical pages. This is achieved by adding a N-channel device with the drain of the N-channel device connected to the common source line of each single byte and the source of the N-channel device connected to ground. For example, the source line of selected byte in first row is biased to ground through the N-channel device. By applying Vdd to SG(0) and floating the rest of source lines by applying ground to the rest of SG(k) in either horizontal page or vertical page during Program 4 operation.

Figure 5:
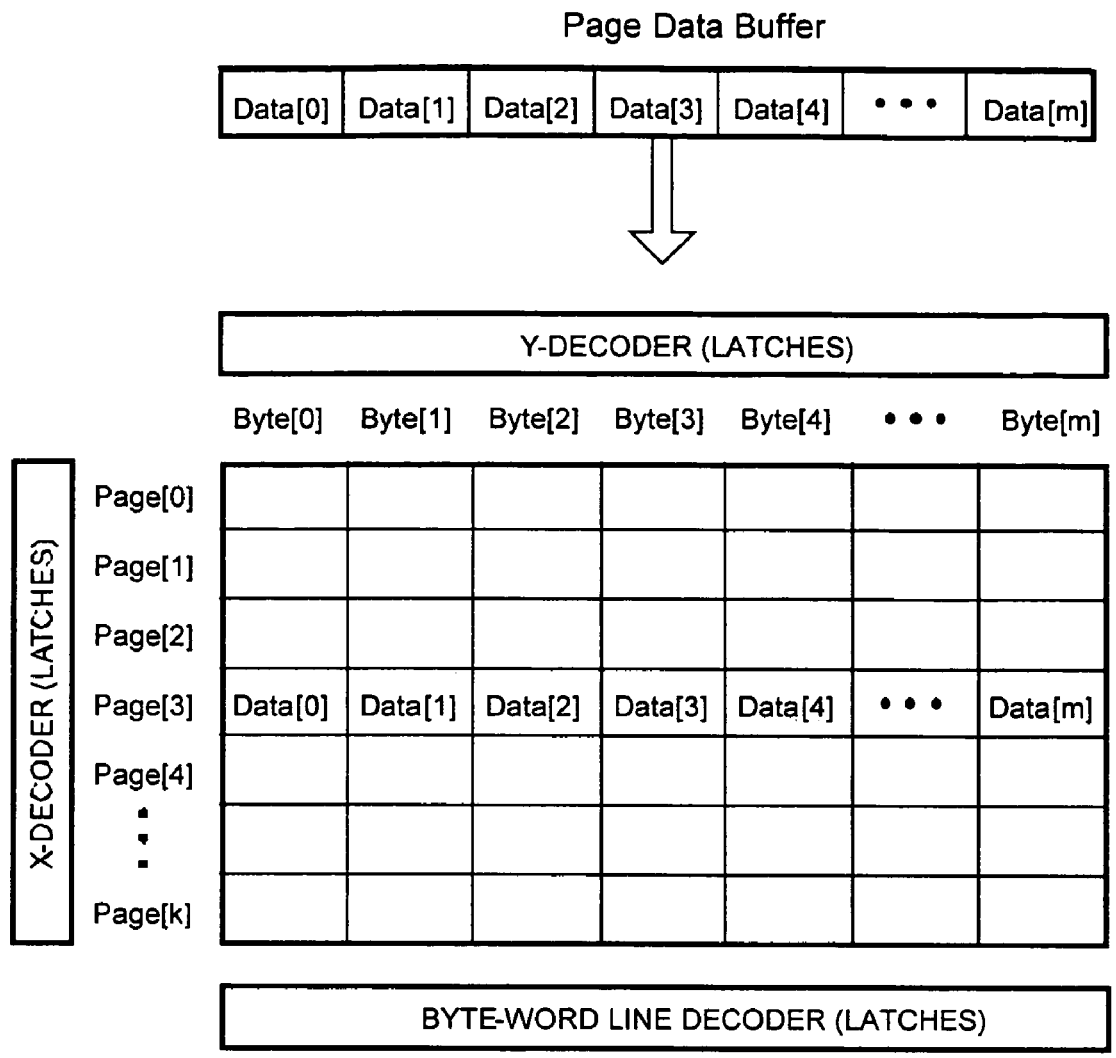
FIG. 5 is a diagram of the present invention showing a map of data writing into a horizontal page partitioned into bytes from a Page Data Buffer.

In FIG. 5 is shown an architectural diagram of the decoding of the horizontal pages shown in FIG. 3. A map of data is shown writing into a horizontal page partitioned into bytes from a Page Data Buffer at periphery through a Y-decoder having latches in each output. Each output of the X-decoder, which has a latch, allows an independent selection of a row of EEPROM select gates. The Byte-word line decoder is physically located at the bottom of the array as a layout option of the present invention. Horizontal pages PAGE(0)-PAGE(k) are contained within an EEPROM array. Each page contains m+1 bytes, BYTE(0)-BYTE(m). If PAGE(3) is selected, the X-decoder will decode PAGE(3) by coupling the select gate SG(3) for PAGE(3) to VDD and coupling ground to the select gates for the other pages, PAGE(0), PAGE(2) and PAGE(4)-PAGE(k). The Y-decoder and byte-word line decoder will decode each byte of the PAGE(3). The latches of X-decoders, byte-word decoders and Y-decoders will be set to remember the numbers of bytes selected for self-timed write operation. Therefore, the data stored in the page data buffer can be written to the corresponded location of the bytes in the page. It should be noted that, for parallel erase operation, the X-decoder, Y-decoder, and byte-word line decoder may contain latches circuitry to provide the multiple selection of the word lines and bit lines for multiple bytes.

Figure 6A:
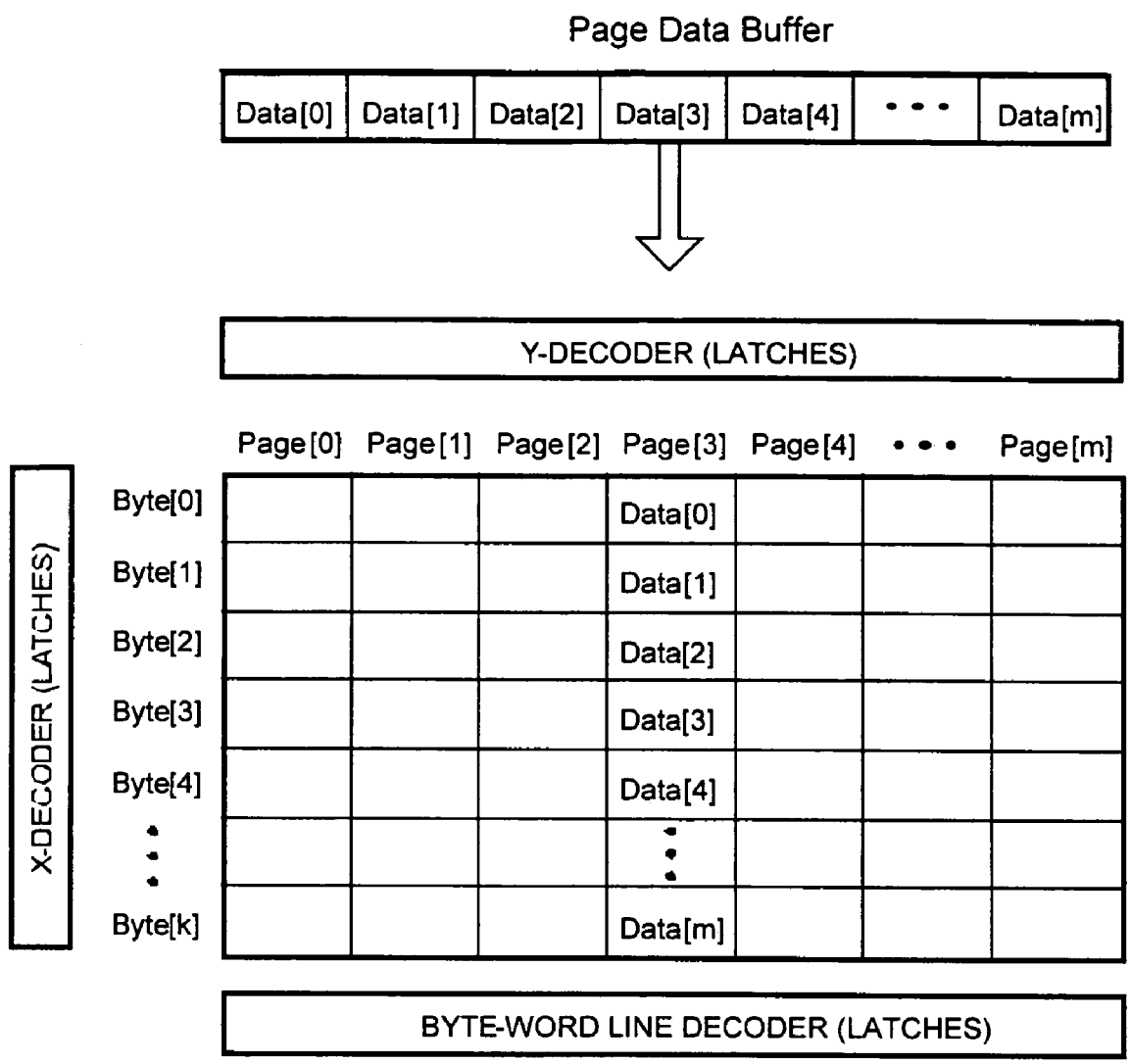
FIG. 6A is a diagram of the present invention showing a map of data for writing into a vertical page partitioned in bytes from a Page Data Buffer.

In FIG. 6A is shown an architectural diagram of the decoding of the vertical pages shown in FIG. 4. A map of data for writing into a vertical page partitioned is shown in bytes from a Page Data Buffer at periphery through Y-decoder having latches in each output. The Byte-word line decoder is physically located at bottom of the array as another layout option. Vertical pages PAGE(0)-PAGE(m) are contained within an EEPROM array. Each page contains k+1 bytes, BYTE(0)-BYTE(k). If PAGE(3) is selected, the Y-decoder will decode the PAGE(3), and the X-decoder and byte-word line decoder will decode each byte of the PAGE (3). Thus, the data of the page data buffers can be written to the corresponded bytes in the vertical page, PAGE (3). The X-decoder, Y-decoder, and byte-word line decoder can contain latches circuitry to provide multiple-byte parallel erase operation.

Figure 6B:
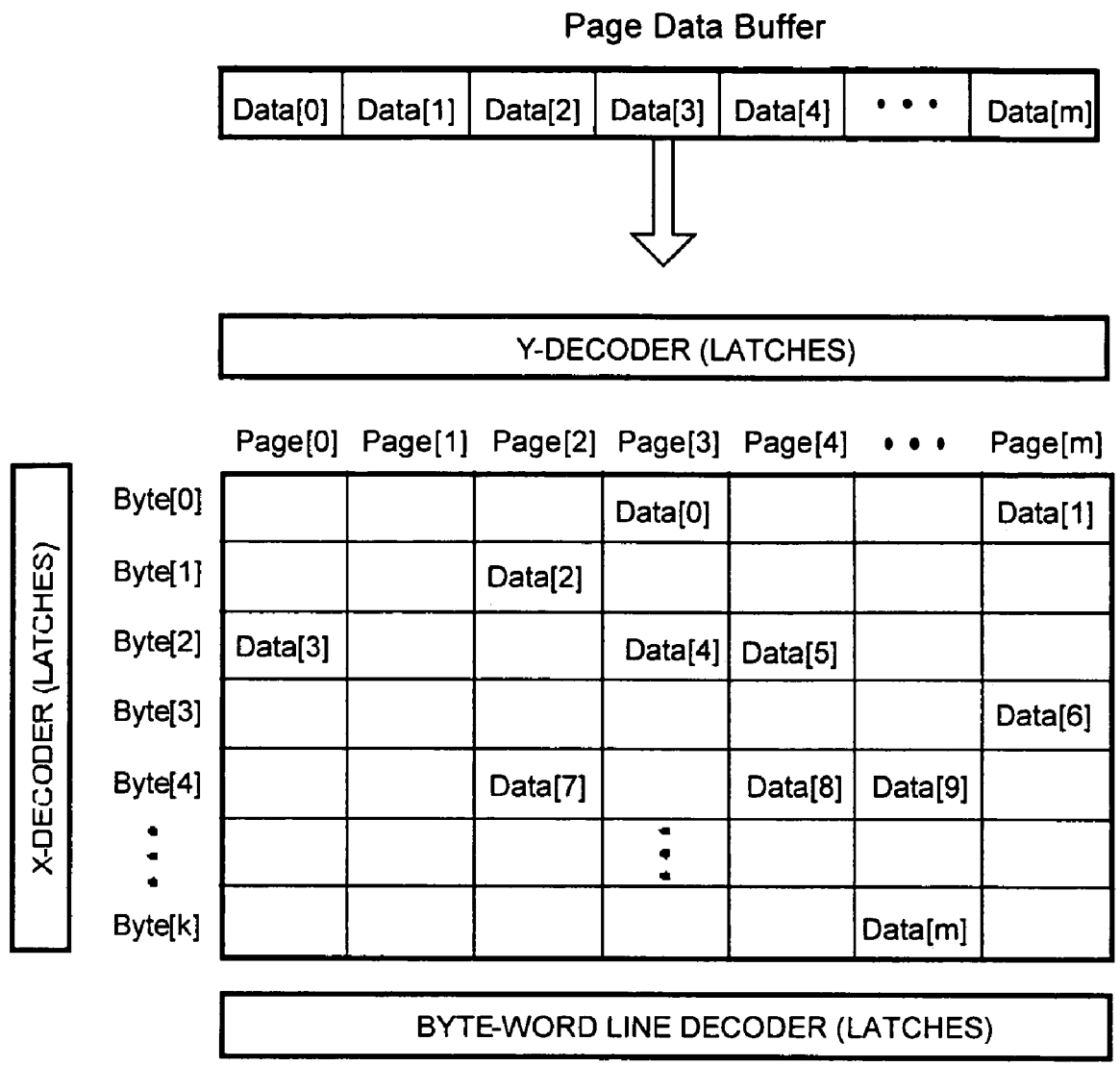
FIG. 6B is a diagram of the present invention showing a map of data for writing bytes of data randomly into vertical pages from a Page Data Buffer.

In FIG. 6B is shown an architectural diagram of the decoding of bytes of data into the random pages. The map of data shows a random page of data for writing bytes distributed across a plurality of vertical page partitions from a Page Data Buffer at periphery through Y-decoder having latches in each output. The Byte-word line decoder is physically located at bottom of the array as another layout option. Vertical pages PAGE(0)-PAGE(m) are contained within an EEPROM array. Each page contains k+1 bytes, BYTE(0)-BYTE(k). The Y-decoder will decode the pages containing the bytes to be programmed, and the X-decoder and byte-word line decoder will decode each byte to be programmed in the vertical pages PAGE(0)-PAGE(m). Thus, the data of the page data buffers can be written to the corresponded bytes in the random pages. The X-decoder, Y-decoder, and byte-word line decoder can contain latches circuitry to provide multiple-byte parallel erase operation.

Figure 7:
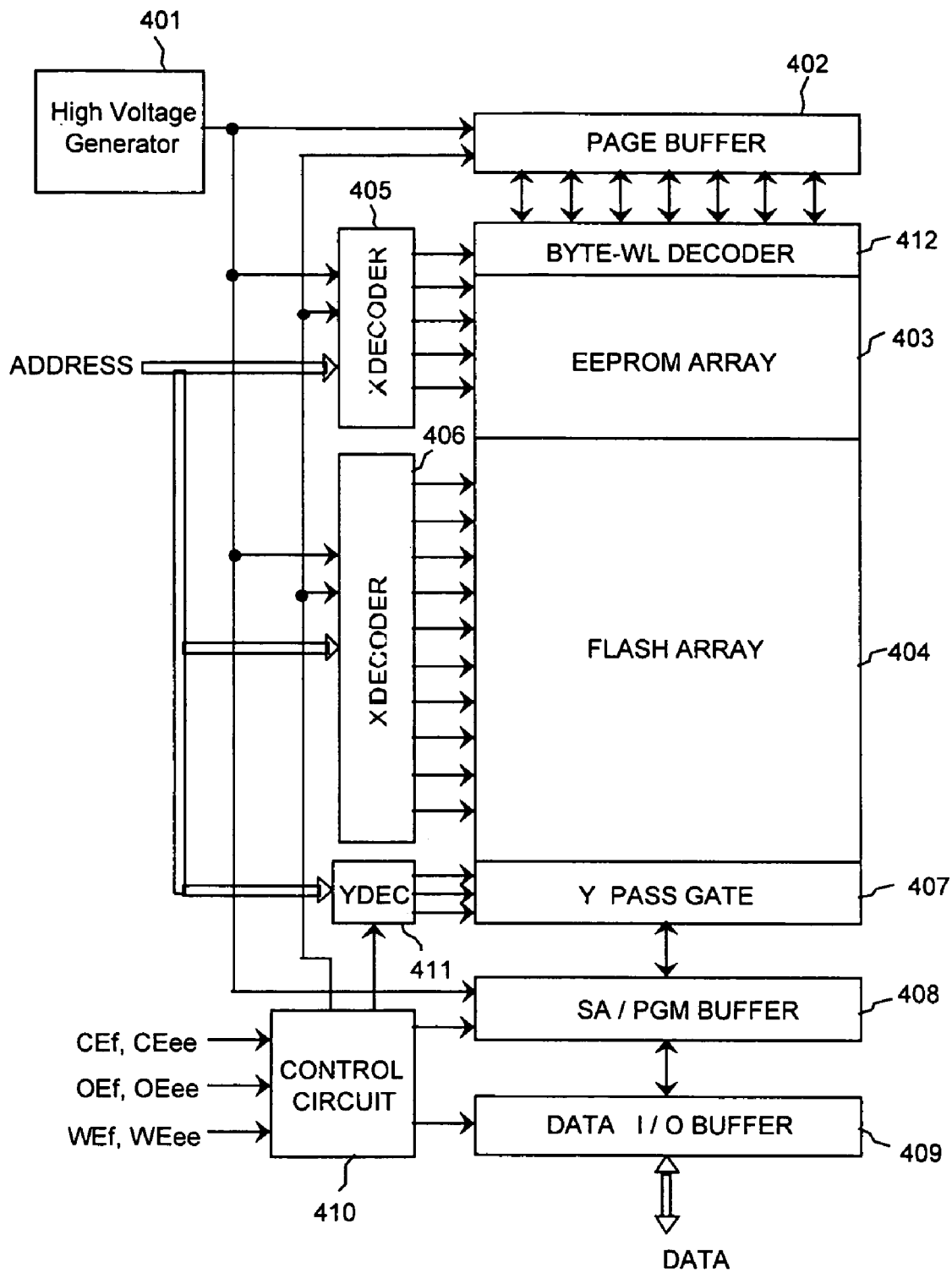
FIG. 7 is a block diagram of the present invention that combines an EEPROM array and a Flash array sharing the same bit line facilities.

In FIG. 7 is shown a combination two-transistor EEPROM and one-transistor Flash nonvolatile memory of the present invention, which use a unified cell structure, and program and erase schemes. The EEPROM array and a Flash array share the same bit line facilities, which include the Y-decoder (YDEC), the bit line select (Y-PASS-GATE), sense amplifiers and program buffers (SA/PGM BUFFER), Data I/O buffers and high-voltage generator. Separate X-decoders are used for the EEPROM array and the Flash array.

Continuing to refer to FIG. 7, the EEPROM array 403 and the Flash array 404 are stacked vertically so as to share bit lines connected through the Y pass gate 407 to the sense amplifier and program buffer 408. Data is transferred to and from the sense amplifiers and program buffers through the data I/O buffer 409. Addresses are supplied to the X-decoders 405 and 406 and the Y decoder 411 for addressing different word lines of the EEPROM and Flash memory respectively. Byte-word (BYTE-WL) decoder is dedicated for selecting byte-word of the EEPROM memory. Both the EEPROM array and Flash array require on-chip high voltage charge pumps for erase and program operations. A high voltage generator 401 connects the high voltages needed for erase and program operation to the page buffer 402, X-decoder 405 and 406, and the sense amplifier and program buffer 408. The page buffer 402 is connected to the byte-word decoder 412 to provide a byte wide data to a selected byte within a page. The chip-enable CE and output-enable OE connected to the control circuitry 410 are assigned to the individual memory arrays to avoid data contention in read operation. Also connected to the control circuitry 410 is write-enable WE. Since a CPU will not read data from the two different memories simultaneously, the address lines, and data lines can be shared by the two nonvolatile memories. The Flash array is used to store program code or data and is erased by page or block. The EEPROM array is used for storing data in bytes that requires high-frequency change rates.

An important feature of the combination memory of FIG. 7 is that the Flash array data can be read out while erasing the EEPROM array without any wait state. EEPROM cells only require −18V at the byte-word lines during an erase operation. As a result, all common bit lines of this combinational memory can be fully utilized by the read operation of the Flash array without disturbing the erase operation of the EEPROM array without need of erase verification. During the EEPROM CHE program operation, few selected bit lines require 6V. The Flash data can be simultaneously read out from the un-selected bit lines for program and program verification operations without any wait state. This is not a perfect read while program operation. As a result, a full simultaneous read and erase operation is offered with a limited simultaneous read and program operation. An array structure of a non-uniform block of Flash arrays of prior art is used in cellular phone application. Smaller blocks are used like EEPROM arrays but are actually a pseudo EEPROM arrays, which cannot be erased by units of bytes. In order to mimic an EEPROM array, a large array penalty and complicated software are required for reading code from Flash and simultaneously writing data to on-chip pseudo EEPROM array. The combination nonvolatile memory of the present invention overcomes the bottleneck and provides a real EEPROM array to simplify the software development and enhance the read performance.

Figure 8:
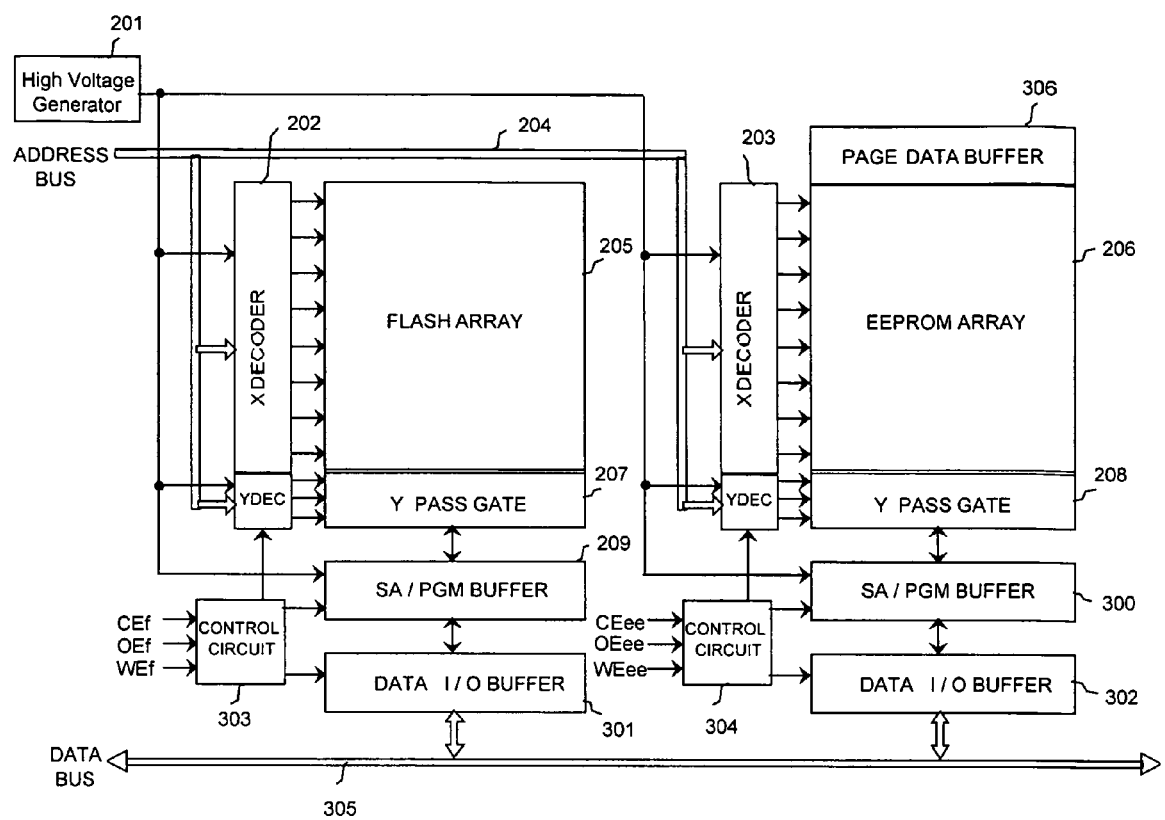
FIG. 8 is a block diagram of the present invention of separate EEPROM and Flash array with a shared data bus and separate addressing structure.

In FIG. 8 is another array structure of the present invention comprising Flash and EEPROM arrays in separate address space by bit line selection but sharing the same data bus 305, address bus 204, high voltage generator 201, and erase/program control circuitry 303 and 304. This structure contains two individual arrays 205 and 206, decoders 202 and 203, Y pass gates 207 and 208, sense amplifiers and program buffers 209 and 300, and I/O buffers 301 and 302. This allows each array to be independently accessed for erase, program, and read operation, and the structure is suitable for simultaneously read and write operations that are used in cellular phone applications.

Continuing to refer to FIG. 8, the EEPROM array contains both the program buffer 300 and the page data buffer 306. The page data buffer 306 is used to make the interface of the chip containing the array compatible with conventional page-mode EEPROM arrays. Therefore, when the page data for the EEPROM array is the input, the data is stored in the page data buffer 306. After the entire page is transferred, the self controlled write cycle of the internal state machine is started for the EEPROM memory when WEee is activated. Since high-speed CHE programming is used parallel page mode programming is not preferred because of the high current associated with CHE programming. Therefore, the data stored in the page data buffer is transferred to the program buffer bit by bit, and then the program buffer performs the high-speed CHE programming to the corresponded cell through the Y-decoder, until the entire page data buffer's data is programmed. Assuming a page buffer contains 128 Bytes, and the average CHE programming time is 5 us per cell, the total programming for the bit-by-bit program operation is (5 us×128 Bytes×8 bit=5.12 ms), which is suitable for conventional EEPROM product program specification requirement of 5 ms.

Figure 9:
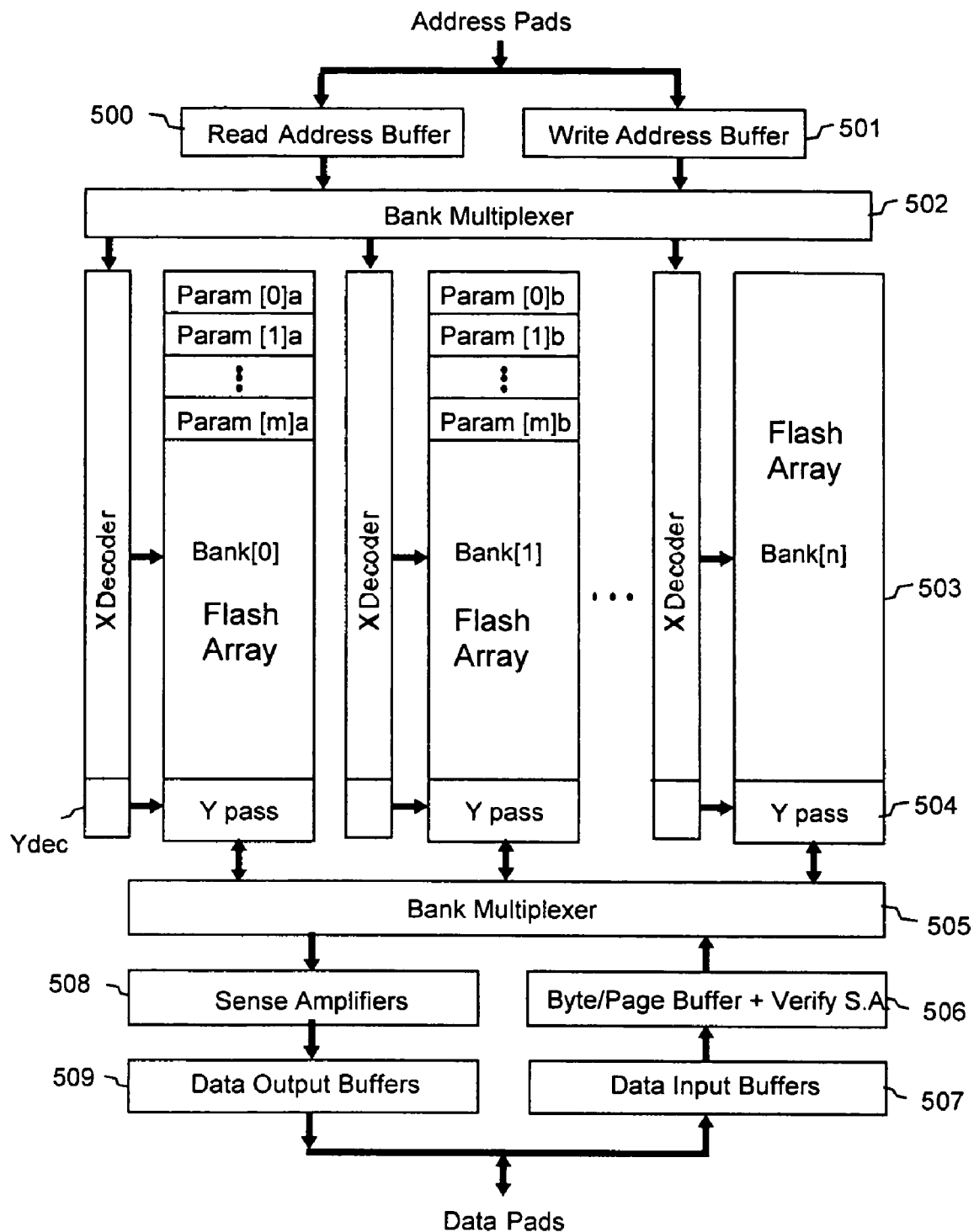
FIG. 9 is a block diagram of a memory of prior art of a typical combinational nonvolatile memory having a plurality of Parameter blocks of EEPROM memory mixed with a plurality of Flash memory banks.

In FIG. 9 is shown a conventional Flash memory chip architecture that has simultaneous read and write capability. The block diagram of the memory of prior art is a typical combinational nonvolatile memory having a plurality of Parameter blocks, for example Param(0)a, of EEPROM memory mixed with a plurality of Flash memory banks, either in the same side or the opposite side of X-decoder performing simultaneous read and write operations. Only the Parameter blocks of EEPROM cells share the same bit lines with Flash cells in bank[0] and bank[1].

The memory array of FIG. 9 is divided into a plurality of memory banks Bank(0), Bank(1) to Bank(n). One of more of the banks contain several smaller memory blocks called parameter blocks Param(0)a to Param(m)a and Param[0]b to Param(m)b. The parameter blocks are used to emulate the function of a conventional EEPROM and are used to store the frequently updated data, while the Flash arrays in Banks(0), Bank(1) to Bank(n) 503 are used to store the less-frequently altered program code. Address data is fed into the chip from chip pads to a read address buffer 500 and a write address buffer 501. The read address and the write address are connected to the X-decoder and Y-decoder of the various memory banks by the bank multiplexer 502. Data is passed to and from the data pads through a data output buffer 509 and a data input buffer 507. Data to and from the memory banks is connected to a bank multiplexer 505 by Ypass gates 504 controlled by the Y-decoder Ydec. The bank multiplexer 505 connects data read from the memory banks to the sense amplifiers 508, which connects the data read from the bit lines of the memory banks 503 to the data output buffers 509. Data that is to be written into the memory banks 503 is fed from the data input buffers 507 by means of the byte/page buffer 506 through the bank multiplexer 505 to the Ypass gates and then to the memory cells selected by the X-decoder and the Y-decoder.

Continuing to refer to FIG. 9, the parameter blocks are made by using the same one transistor Flash cells as the cells used in the Flash arrays located in the Bank(0), Bank(1) to Bank(n) 503. This does not require complex process to combine two different array structures using one cell technology in one chip. However, the parameter blocks are not true EEPROM function-compatible, because the parameter blocks made from one transistor Flash cells do not have byte-erase capability. Therefore, they have to use a complicated software approach to simulate the byte-erasable operation of the conventional EEPROM. This software solution causes degradation of the system performance; and may cause reliability problem.

Figure 10:
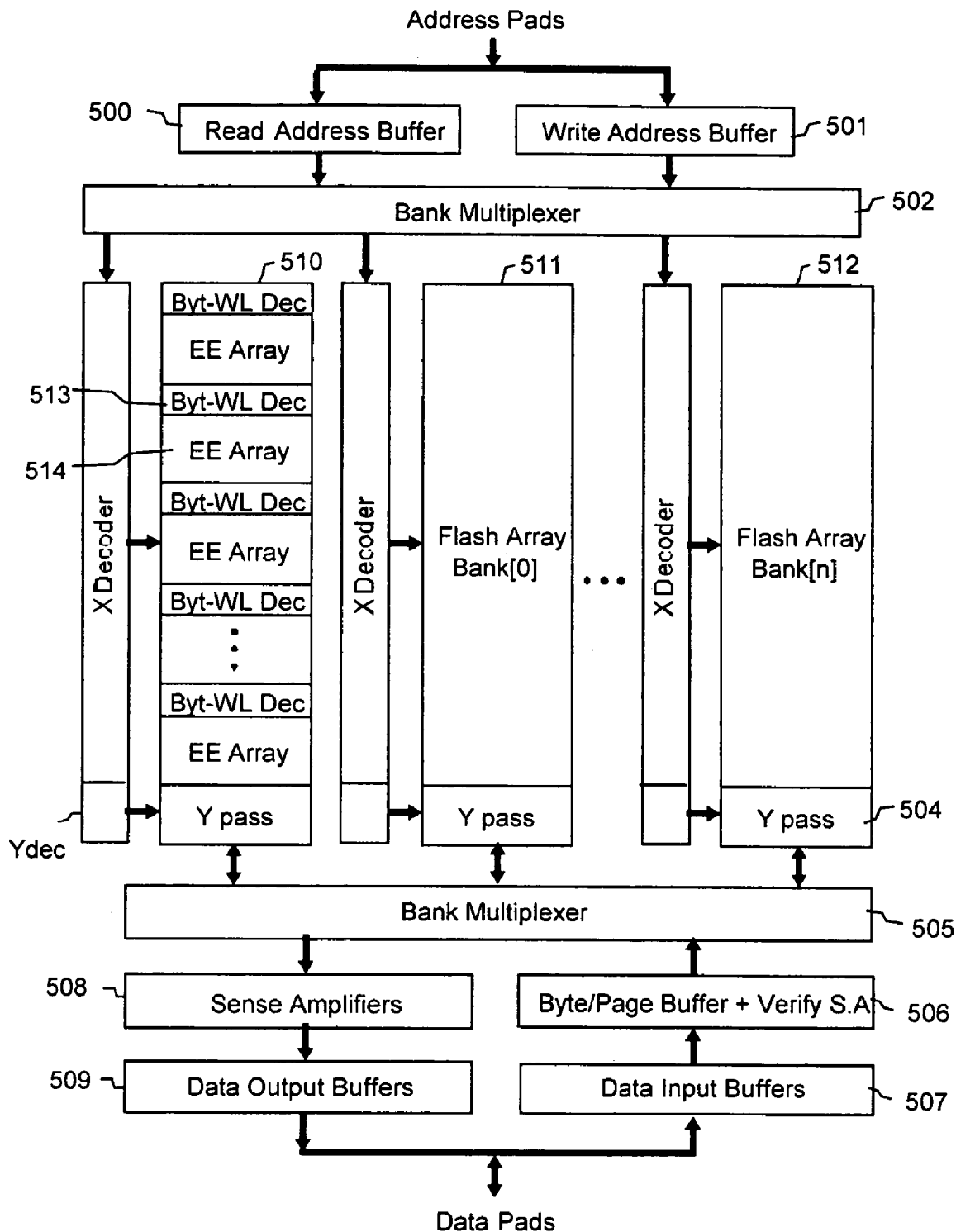
FIG. 10 is a block diagram of the present invention with two-transistor EEPROM and one-transistor Flash arrays in separate memory banks to perform simultaneous read and write, where no bit line is shared between Flash and EEPROM memory.

In FIG. 10 is shown a preferred embodiment of the chip architecture of the present invention that combines a byte-erasable two transistor EEPROM array and block-erasable one transistor Flash memory array in a single chip by using an identical simple stacked-gate (ETOX) technology. The general structure the multi-bank memory of the preferred embodiment shown in FIG. 10 is similar to that of the prior art memory shown in FIG. 9; therefore the discussion herein will be centered on what is different in the preferred embodiment of the present invention.

Continuing to refer to FIG. 10, the memory structure contains an individual EEPROM array 510 that uses the two-transistor EEPROM memory cell and the byte-word line decoder of the present invention. The memory structure also contains a Flash array that uses the one-transistor Flash memory cell of the present invention, which is divided into a plurality of individual Bank(0) 511 to Bank(n) 512. The Flash arrays and the EEPROM arrays can be individually selected by the associated X-decoder, Y-decoder, and the Y-pass gates. The memory structure contains a plurality of individual arrays that are partitioned to allow simultaneous operations, including: Read-while-Write, Write-while-Write, and Read-while-Read if separate Data pads are used for the respective memories.

The Bank Multiplexers 502 and 505 are the key circuit blocks in performing the simultaneous functions of the chip containing the multiple memory banks 510, 511, 512. The bottom Bank Multiplexer 505 can select any of the Flash banks 511 and 512 and the EEPROM array 510 to be connected to the read circuitry that contains the Sense Amplifiers 508 and Data Output Buffer 509 for performing a read operation while selecting another EEPROM array or a Flash array bank to be connected to the write circuitry that contains Byte/Page Buffers and Verify Sense Amplifiers 506 and Data Input Buffers 507. At the same time, the top Bank Multiplexer 502 can select and send address from the Read Address Buffer 500 and Write Address Buffer 501 to the corresponded X-decoder and Y-decoder of the selected banks. Therefore, two or more arrays and banks in the chip can perform simultaneous read-and-write operation.

Continuing to refer to FIG. 10, the Byte/Page Buffer 506 is used to perform the storage of the programmed data and control programming tasks such as applying high voltage to the bit lines of the selected cells. The Byte/Page Buffer 506 contains any number of bits determined by the application requirements. For example, in a system that requires a byte-wide instant data update function, the Byte/Page Buffer 506 may contain only one-byte (eight bits) buffers to store the data and program the eight bits into the memory array on the following write operation. However, for a system that features page update operations, then a whole page worth of data needs to be loaded to the buffer during the load cycle. In this case, the Byte/Page Buffer needs to contain a page-size buffer to temporary store the data and program the data into the memory array in the following write operation. The circuits that implement the Byte/Page Buffer can be latches, flip-flops, shift-registers, or any other suitable circuits. If the buffers use latches or flip-flops, the circuits can have their own decoder circuit to select each byte or unit of data for loading data to and retrieving data from the buffers. The buffers can share the Y-decoder or Y-pass gate circuits with any memory array when needed. For example, in a configuration that requires a 64-byte page in a write application, the 64 bytes of data can be shifted in or loaded in the 64-byte page buffer in a sequence of load cycles. After the 64 byte data is loaded, the data may be retrieved by the program buffer byte-by-byte to perform the program operation. This is particularly valuable for a program operation using CHE injection, since the CHE programming requires high current (i.e. 500 uA) to program each cell. Depending on the current driving capability of the on-chip high voltage pump circuitry, the data may be programmed in one byte, a partial byte, or even one bit to reduce the pump circuit output current requirement and charge pump circuit size. The program operation is performed after the successful erase operation of the selected bytes.

Continuing to refer to FIG. 10, it should be noted that the number of the Sense Amplifiers 508, Data Output Buffer 509, Byte/Page Buffers and Verify Sense Amplifiers 506, and Data Input Buffer 507 can be any multiple of the system data interface bus. For example, assuming the system has a one-byte data bus. The number of sense amplifiers can be a multiple number of bytes, such as sixteen bites. This will allow two banks to be read to the output buffers at the same time. Similarly, if sixteen Data Input Buffers 507 and Byte/Page Buffers and Verify Sense Amplifiers 506 are used, two bytes of data can be inputted and programmed to two individual banks simultaneously. This allows simultaneous Read-while-Read and Write-while-Write operations since the read operation and some write operation may need to occupy the data input/output interface at the same time. To simplify the description of these operations, they will be called simultaneous read-and-write operation in the following description of the present invention.

Figure 11:
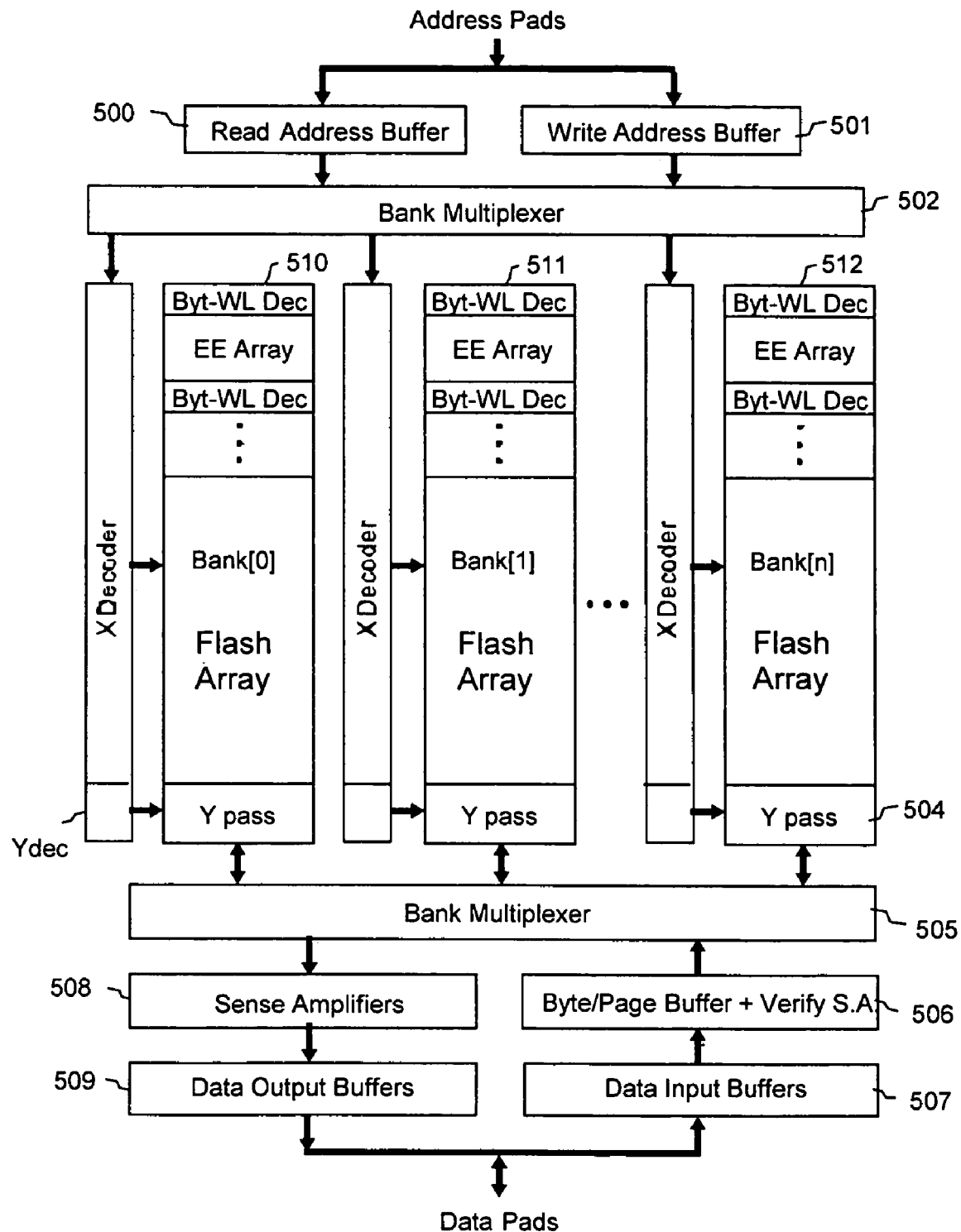
FIG. 11 is a block diagram of the present invention with EEPROM and Flash memory arrays sharing bit lines in the same memory banks to perform simultaneous read and write.

In FIG. 11 is another embodiment of the present invention showing a chip architecture that combines the byte erasable two transistor EEPROM arrays with the block erasable one transistor Flash memory array using the same stacked gate technology. This embodiment differs from the previous embodiment of FIG. 10 by placing the EEPROM memory arrays, each with a byte word line decoder, together with a large Flash memory array in the same memory bank 510, 511 and 512. Since the EEPROM memory cell is small and accommodates the bit line pitch of the Flash memory cell, the two memories are easily coupled to the same bit line within a memory bank without sacrificing additional space. Although the EEPROM arrays are shown located at the top of a memory bank, they can easily be located anywhere within the memory bank. Multiple banks can be selected for simultaneous 'read while erase' but only limited 'read while program' operations can be performed.

Figure 12:
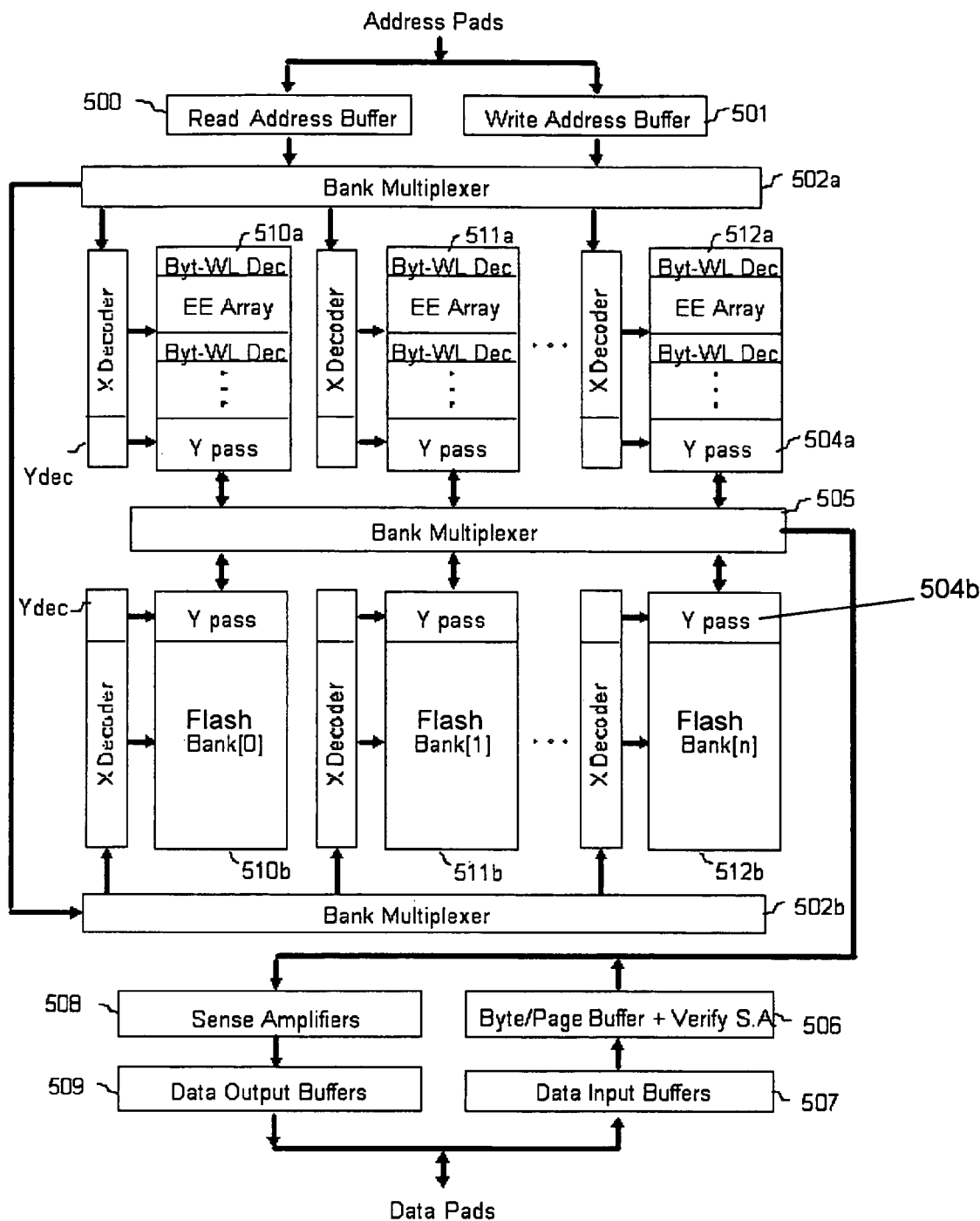
FIG. 12 is a block diagram of the present invention with multiple EEPROM banks and multiple Flash banks with separate bit lines to perform multiple simultaneous read and write.

In FIG. 12 is shown another embodiment of the chip architecture of the present invention. This embodiment varies from the previous embodiments in the number of memory banks containing EEPROM array and the number of memory banks containing Flash memory arrays. The EEPROM arrays with their attendant byte word line decoder are place into memory banks 510*a*, 511*a*, and 512*a* while the Flash arrays are in memory banks 510*b*, 511*b* and 512*b*. Y-pass gates 504*a* controlled by the Y-decoder connect data to and from the memory banks 510*a*, 511*a* and 512*a* containing the EEPROM arrays. In like manner the Y-pass 504*b* gates controlled by the Y-decoder connect data to and from the memory banks 510*b*, 511*b* and 512*b* containing the Flash memory arrays. Bank multiplexer 502*a* connects addresses from the read address buffer 500 and the write address buffer 501 to the X-decoder and Y-decoder of the memory banks 510*a*, 511*a* and 512*a*. Bank multiplexer 502*b* connects addresses from the read address buffer 500 and the write address buffer 501 to the X-decoder and Y-decoder of the memory banks 510*b*, 511*b* and 512*b*. Each individual array can be selected by the bank multiplexer 505 to perform the multi-tasking of simultaneous read-and-write operations. For example, any two EEPROM arrays, or any two Flash memory arrays, or any single EEPROM array and any single Flash memory array can be selected by the bank multiplexer 505 to perform simultaneous read-while-read, read-while-write, or write-while-write operations, which provides flexibility for the multiple functions that the chip can perform. The configuration shown in FIG. 12 is suitable for memory card applications.

Figure 13:
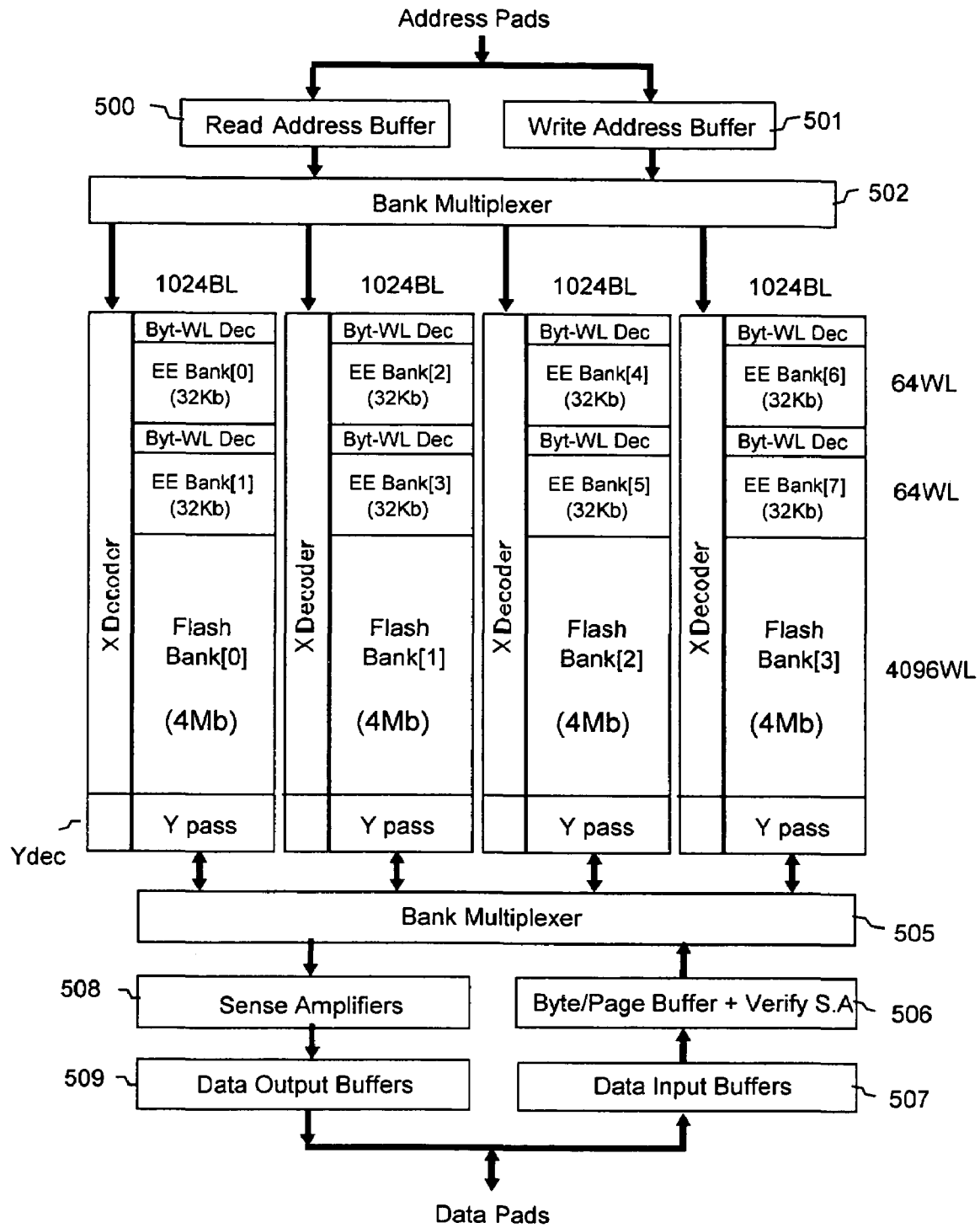
FIG. 13, is a block diagram of the present invention with multiple banks each containing EEPROM and Flash arrays sharing bit lines to perform multiple simultaneous read and write.

In FIG. 13 is shown a memory contained on a chip using the combination of Flash and EEPROM memory arrays of the present invention. The chip contains 16 Mb of Flash memory, 4 Mb in each of four Flash memory banks, and 256 Kb of byte erasable EEPROM memory, 32 Kb in each of eight EEPROM memory banks. Associated with each 32 Kb EEPROM memory array is a byte word line decoder. Each section of the combined memory has 1024 BL (bit lines). Each of the 32 Kb EEPROM memory array is coupled to 64 WL (word lines) and each 4 Mb Flash array is coupled to 4096 WL (word lines). The use of the EEPROM cell of the present invention results in a small chip size, which contains high-density Flash and EEPROM memories. The chip architecture of FIG. 13 performs simultaneous read-and-write operations.

Figure 14:
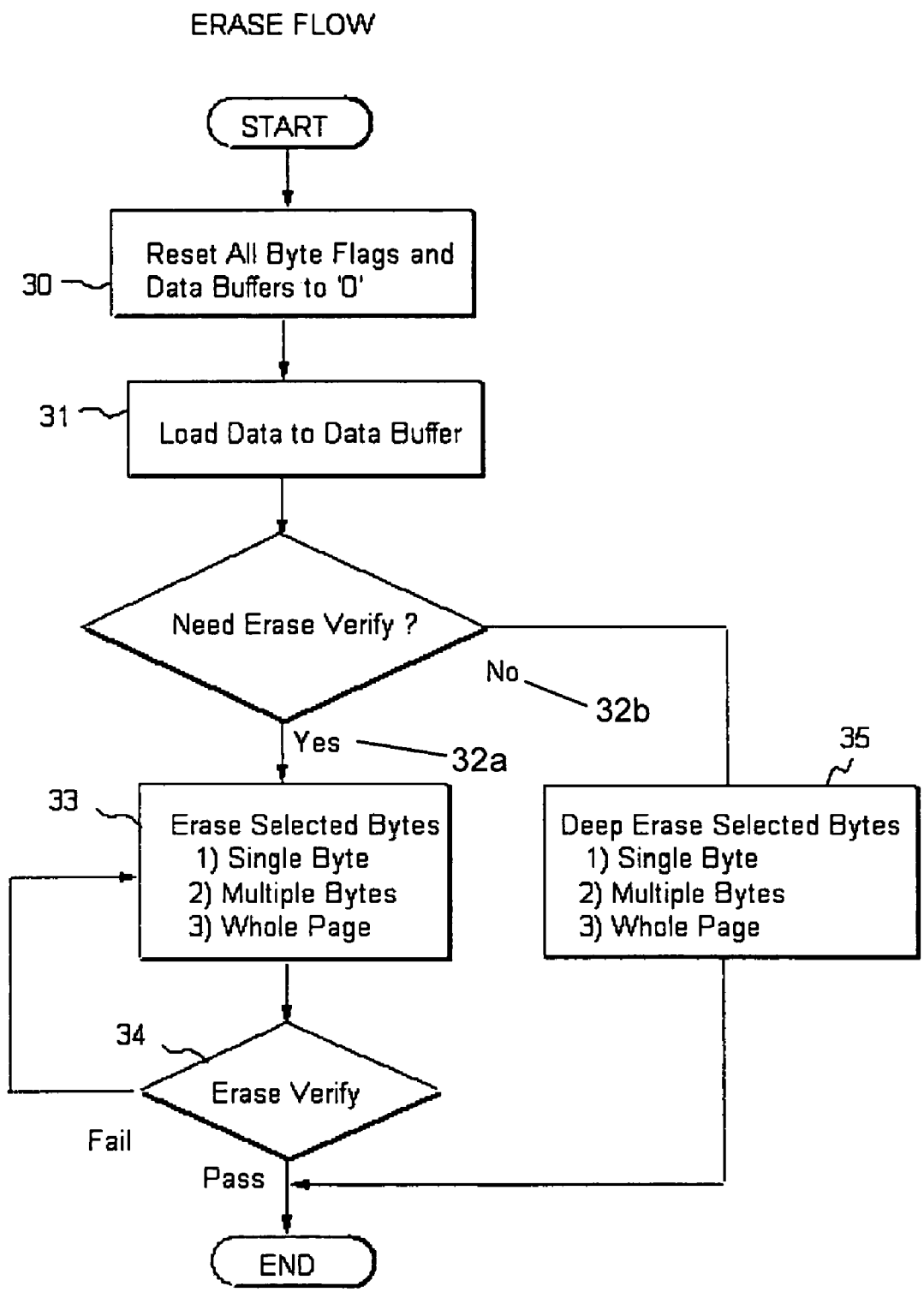
FIG. 14 is a flow diagram of the method of erasing the EEPROM array of the present invention.

In FIG. 14 is shown of the method of the present invention to perform an erase operation on an EEPROM array. There is on-chip page data buffer designed to store the write data in the size of the page. The page size is usually around 128 B or 256 B. The page buffer comprises of a plurality of latch-cells. Each bit of data requires a latch-cell to store the data for a write operation. The data to be changed is in units of bits or bytes and only a single byte or multiple bytes of data are required for changes. A whole page may need to be updated with the same programming and erase P/E performance, in which there are 128 B or 256 B within the page. Each byte has one dedicated bit called a byte flag. This flag is used to store the information about which byte is to be selected for erase and program.

Continuing to refer to FIG. 14, when EEPROM is selected to perform write operation, all bytes of page buffers and all bits of byte-flag are to reset to a logical "0" 30. New data is then loaded into the on-chip page buffer 31 by means of one or more input buffers and is clocked in by a system clock. New data containing a logical of "1" will over-write old data containing a logical "0". The bits of byte-flags will be set when the data of the selected bytes require a change or update. Before an erase operation is performed it is decided whether an erase-verified is needed or not. In EEPROM design of the present invention, erase-verify is not a required operation.

When an erase verify is chosen 32*a*, then an iterative series short pulses of erase 33 and verify 34 are performed. The number of short pulses required depends on the allowed erase time. For better P/E quality and better endurance cycles, more short pulses are preferred. As a result of built-in page buffers and byte-flag circuits, the data can be erased in units of bytes, for example, a single byte, multiple bytes and a page that contains 128 B or 256 B. The specification of erase time for single byte, multiple bytes or a page is the same, approximately 5 ms. The width of erase pulse can be set to 1 ms or 100 us depending on the characteristics of the EEPROM cells. For a 1 ms pulse width, a total of 5 pulses can be applied for tight-Vt erase below 1V or 0V depending on which Vt scheme is employed. After the completion of each successful erase pulse, an erase verify 34 is performed by reading out and verifying the data by means of on-chip sense amplifiers. If the Vt of the cells of erased bytes cannot meet the Vt requirement, then the additional erase pulses will be continuously applied one by one for further erase. Erase will only stop when the Vt of the erased cells meet a pre-determined specification. For flexible read while write operation, a preferred erase operation without erase verification can be used for the present invention.

Continuing to refer to FIG. 14, in the flow path that does not require an erase-verify 32*b*, a single long pulse of erase and a single verify is performed. The single erase pulse is approximately 5 ms. The data can be erased in units of bytes, for example, a single byte, multiple bytes and a page that contains 128 B or 256 B. The specification of erase time for single byte, multiple bytes or a page is the same, approximately 5 ms for the EEPROM of the present invention. After the completion of each successful erase pulse, an erase verify is skipped, and if the Vt of the cells of the erased bytes cannot meet the Vt requirement, then the part is scrapped. Erase will only stop when the allowed erase time of 5 ms has expired.

Figure 15:
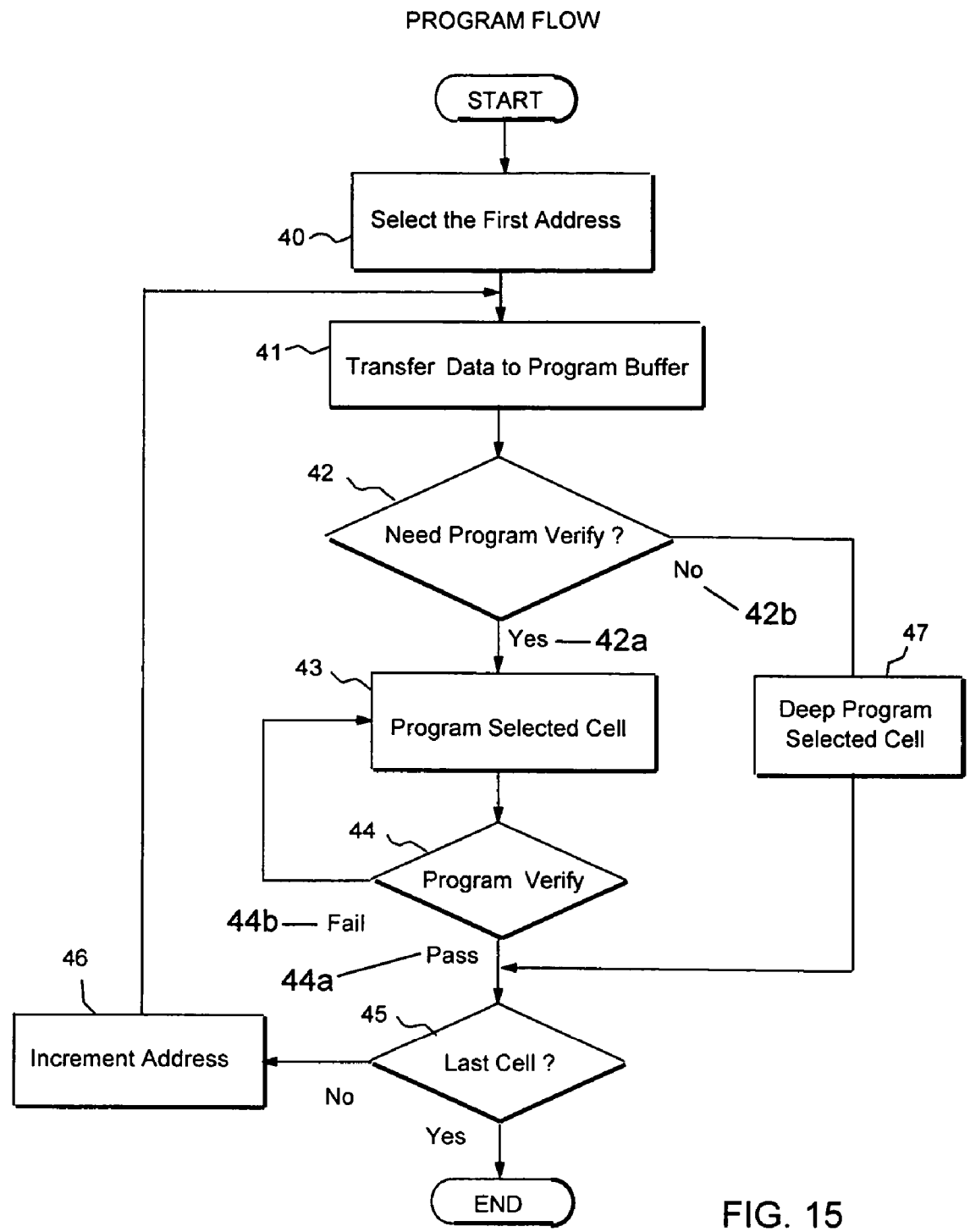
FIG. 15 is a flow diagram of the method of programming the EEPROM array of the present invention.

In FIG. 15 is shown the method of programming the EEPROM cells of the present invention. It should be noted that because of the large program current and fast program speed of the CHE programming scheme, single bit or several bit programming is preferred over the page programming. To do this the internal address counter will control the data stored in the page data buffer to be transferred to the program buffer bit by bit. The program buffer becomes responsible for applying program pulses to the selected cell according to the desired data. The first memory cell is selected 40 and data is transferred to the program buffer 41. If the need for verification 42 has been pre selected 42*a*, then after the completion of each program pulse, a program-verify operation 44 is performed. If the program data does not meet the specification 44*b*, a second program pulse is applied 43. Once a particular byte meets the Vt specification 44*a*, the address counter will increment to the next cell 46, and then repeat the program verify step for the next cell 41, 42*a*, 43 and 44. This sequence is repeated until the last address of the page. Only those cells with a Vt that fails 44*b* to meet the program specification will receive additional program pulse of the present invention.

Continuing to refer to FIG. 15, If prior to programming it was decided that program verify was not required 42*b*, then each EEPROM cell to be programmed will receive a deep programming pulse 47 that is larger than the regular 5 us program time. Once the deep programming is completed and if the cell is not the last cell 45, the address is incremented by the program counter and the next data is transferred to the data buffer 41 and the process is repeated 41, 42*b* and 47.

Figure 16:
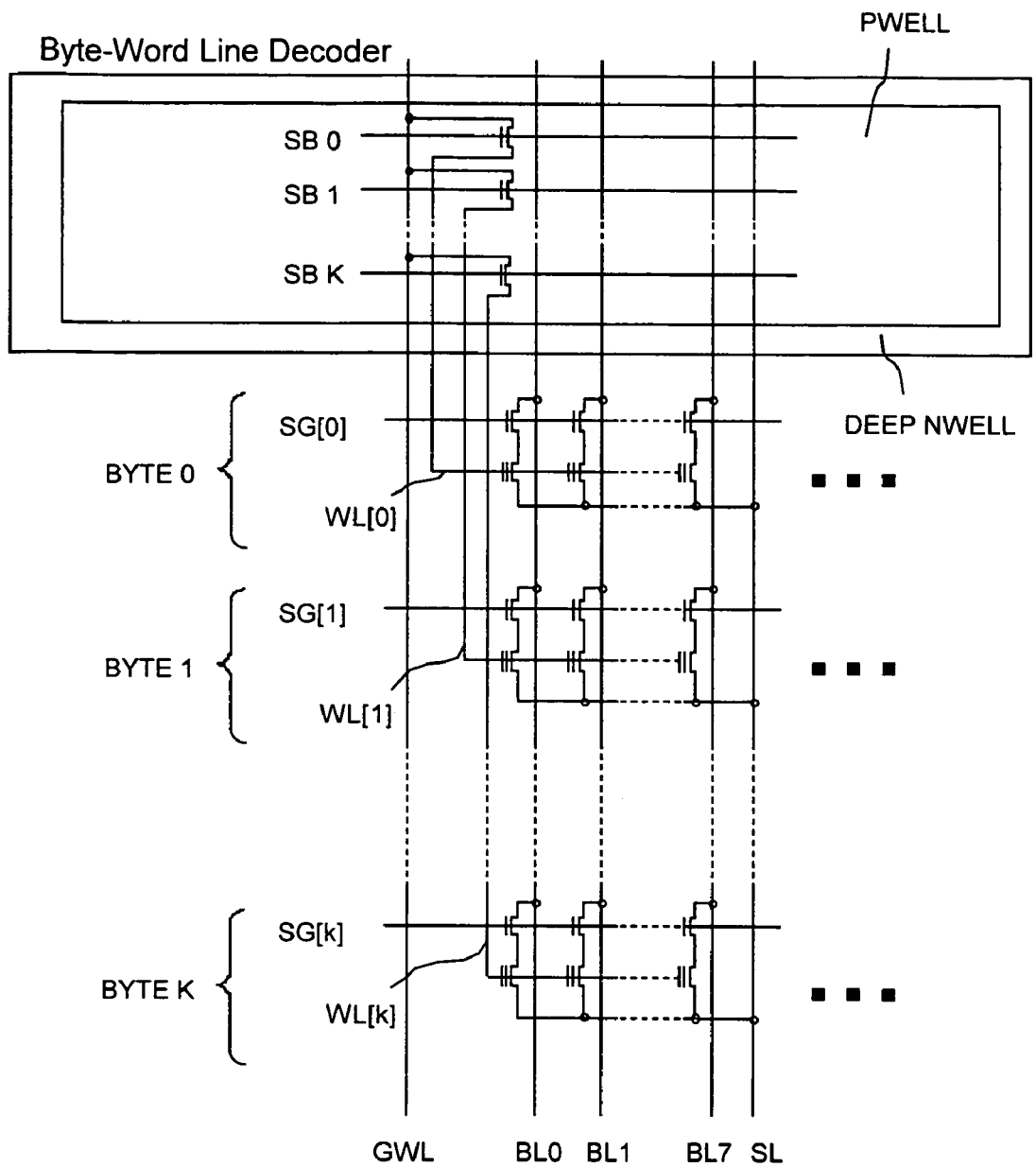
FIG. 16 is a diagram of a first layout and arrangement of byte-word line decoders connected in columns to byte segments of the two transistor cell array of the present invention.

FIG. 16 illustrates a first example of a preferred schematic and physical arrangement for a byte-word line decoder for a two transistor cell array of the present invention. The byte-word line decoder is located in a P-well within a deep N-well at the top of the array vertically in the bit line direction. The select transistors of the EEPROM cells within each page are connected to select gate signals SG(0)~SG(k) which run horizontally across the entire array. Each byte-word line WL(k) is connected to eight EEPROM cells and is vertically connected to each output of byte-word line decoder. Word line WL(0) is connected to the eight EEPROM cells forming Byte(0). Word line WL(1) is connected to the eight EEPROM cells forming Byte(1) and word line WL(k) is connected to the eight EEPROM cells forming Byte(k). A global word line GWL is connected to each local word line WL(0)~WL(k) through the byte-word line decoder gates controlled by decoder signals SB(0)~SB(k). Bit lines BL0~BL7 and the source line SL run vertically in the same direction as the word lines from the Byte-word line decoder.

Unlike prior art that puts the byte-word line decoders in the cell array, which consumes area for the isolation wells, in the present invention the byte-word line decoders are removed from the array and placed at the vertical end of the array. A plurality of byte-word line decoders is organized into one large triple well without any well division to save area. The number of outputs of each byte-word line decoder depends on the numbers of metal layers and the pitch between metal lines. The size of each byte-word line decoder will be proportionally increased when the required number of outputs is increased. Additional metal layers will increase the number of outputs with large savings in the array area as density increases. In one bit line pitch, all different layers of metal lines of different outputs generated from each byte-word line decoder can be stacked together in the $3^{rd}$ dimension, e.g. z-direction, and connected to the respective bytes of WL(k) in the y-direction of cell array. When number of available metal lines is limited, the room for more outputs from byte-word line decoder can be expanded in x-direction to allow more metal lines to connect to more bytes in y-direction.

Figure 17:
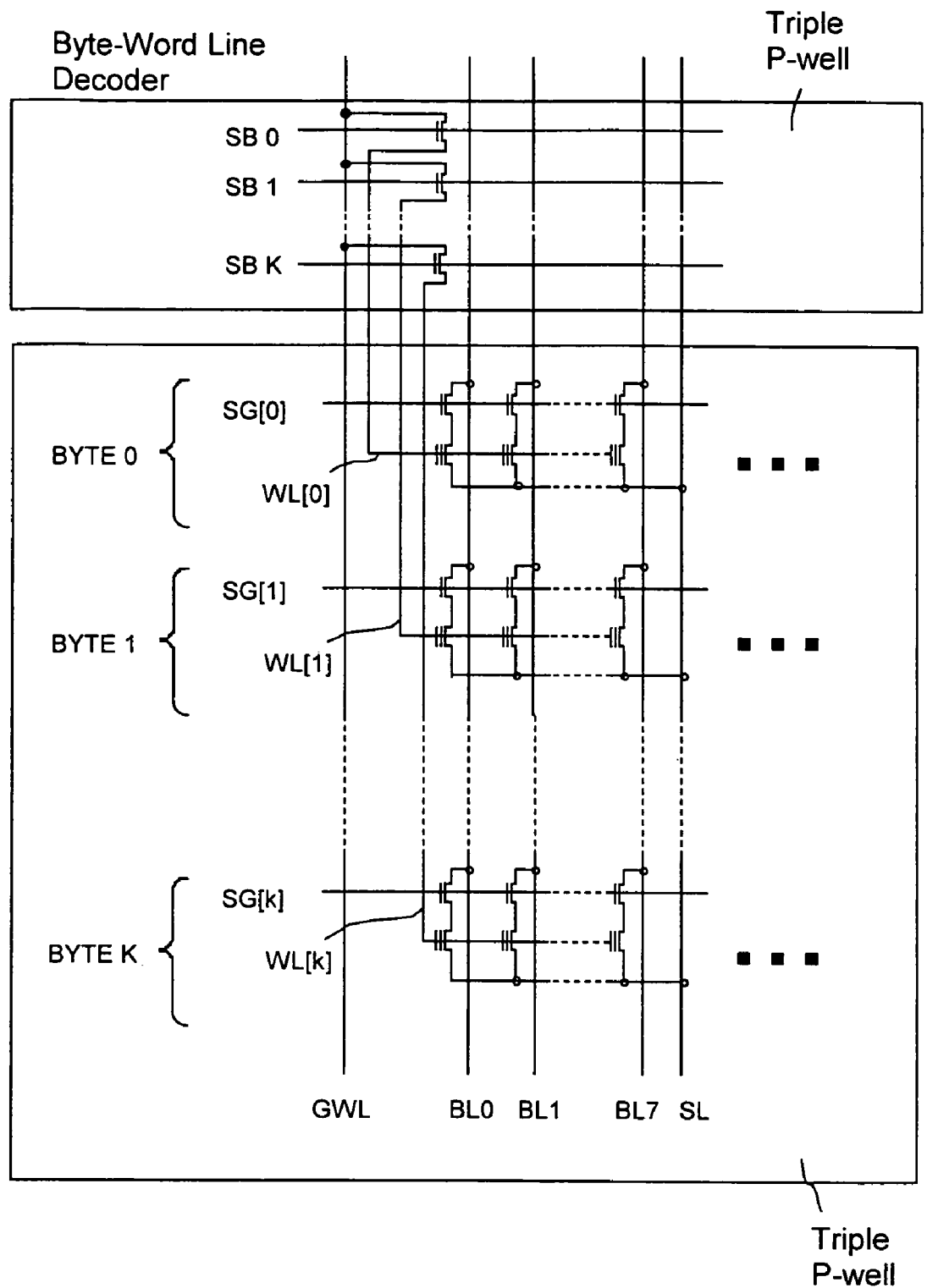
FIG. 17 is a diagram of a second layout and arrangement of byte-word line decoders connected in columns to byte segments of the two transistor cell array of the present invention.

FIG. 17 illustrates a second example of a preferred schematic and physical arrangement of byte-word line decoders and a two-transistor EEPROM cell array of the present invention similar to the configuration shown in FIG. 16. The EEPROM cells in whole cell array are formed in a large triple P-well without any well division for any peripheral devices to save array area. The byte-word line decoder, as show on the top of the array, is located in another triple P-well. The triple P-wells of the cell array and the byte-word line decoder can be independently biased to required voltages. The triple P-wells may be located in a large deep N-well to be isolated from the P-substrate.

Figure 18:
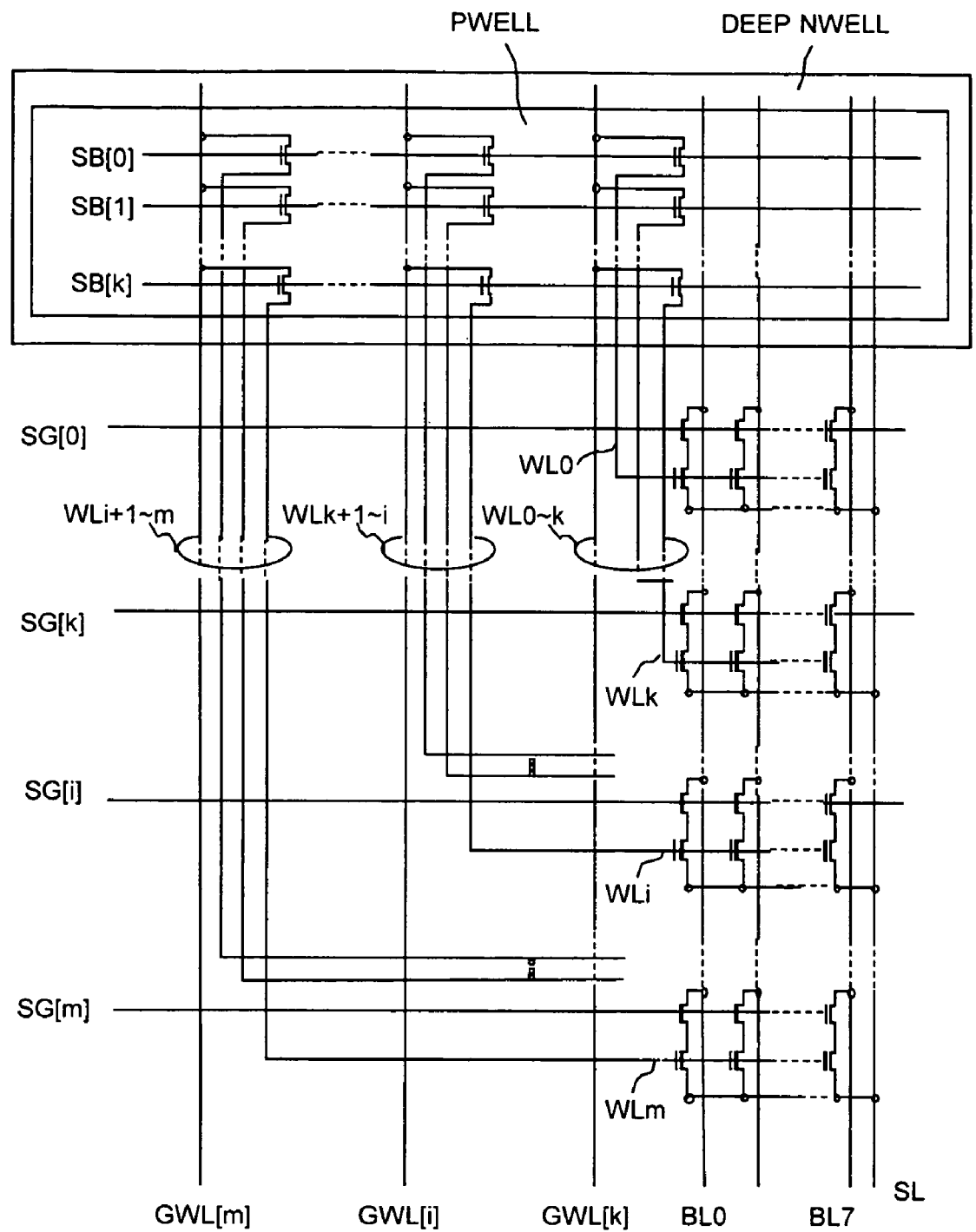
FIG. 18 is a diagram of a third layout and arrangement of byte-word line decoders connected in columns to byte segments of the two transistor cell array of the present invention.

FIG. 18 illustrates a third example of a preferred schematic and physical arrangement of byte-word line decoders and cell array similar to the configuration in FIG. 17 of the present invention. The two-transistor EEPROM cell array has wasted area in the array when additional groups of metal lines of different layers of WLi+1~m and WLi+1~l are running in the bit line directions from top byte-word line decoders. This embodiment allows more metal lines from byte-word line decoders to be connected to more byte-word lines when number of available metal layers is limited by distributing in the horizontal direction the outputs of the byle-word line decoder. For example, word line WLk is connected to global word line GWL(k) through the byte-word line decoder gate controlled by decoder signal SB(k).

Word line WLi is connected to global word line GWL(i) through the byte-word line decoder gate controlled by decoder signal SB(k), and word line WLm is connected to global word line GWL(m) through the byte-word line decoder gate controlled by decoder signal SB(k). All word lines connected to global word line GWL(k) are bundled together and distributed from bundle WL0~k. All word lines connected to global word line GWL(i) are bundled together and distributed from bundle WLk+1~I, and all word lines connected to global word line GWL(m) are bundled together and distributed from bundle WLi+1~m. Although the cell array has area covered by these additional metal lines without any devices underneath, there is still a big savings in total die area because wasted area is collected together.

Figure 19:
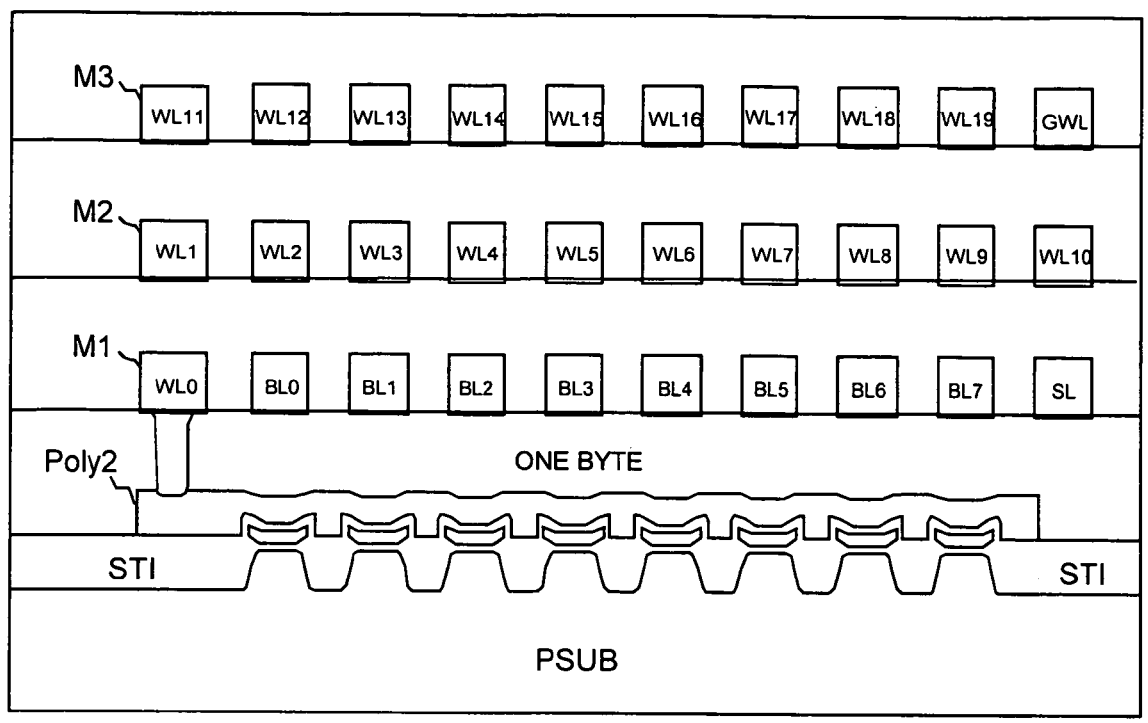
FIG. 19 is a first cross-sectional view of a byte-wide memory segment and the layers of metallization for connecting to the memory segments in a column.

FIG. 19 illustrates the cross-sectional view of one group of metal lines of the cell array in FIGS. 16, 17 and 18 of the present invention. Three metal layers are shown available for inter-connection. The first metal layer M1 closest to cell devices is used for bit line connection. The second metal layer M2 and the third metal layer M3 are used for the vertical (in the direction of the bit lines) connections from the output of the byte-word line decoders. For each bit line pitch can accommodate an output from the decoder on the second M2 and the third M3 layers. Thus a total sixteen word lines WL1~WL16 can be vertically connected to sixteen byte-word lines (or sixteen bytes) along the eight-bit line pitches as shown in FIG. 19.

Continuing to refer to FIG. 19, memory cells totaling to one byte are shown in a P-substrate PSUB. Shallow trench isolation STI is shown at both ends of the eight cells as well as between each cell. A poly2 connection is shown for the word line connecting to each cell which is connected by a via to the first metal layer M1, then connected to the second metal layer M2 through a second via and finally to the third layer M3 through a third via where a connection is made to word line designated as WL9. The source line SL is shown on the first layer of metal and the global word line GWL is shown on the third layer of metal.

Figure 20:
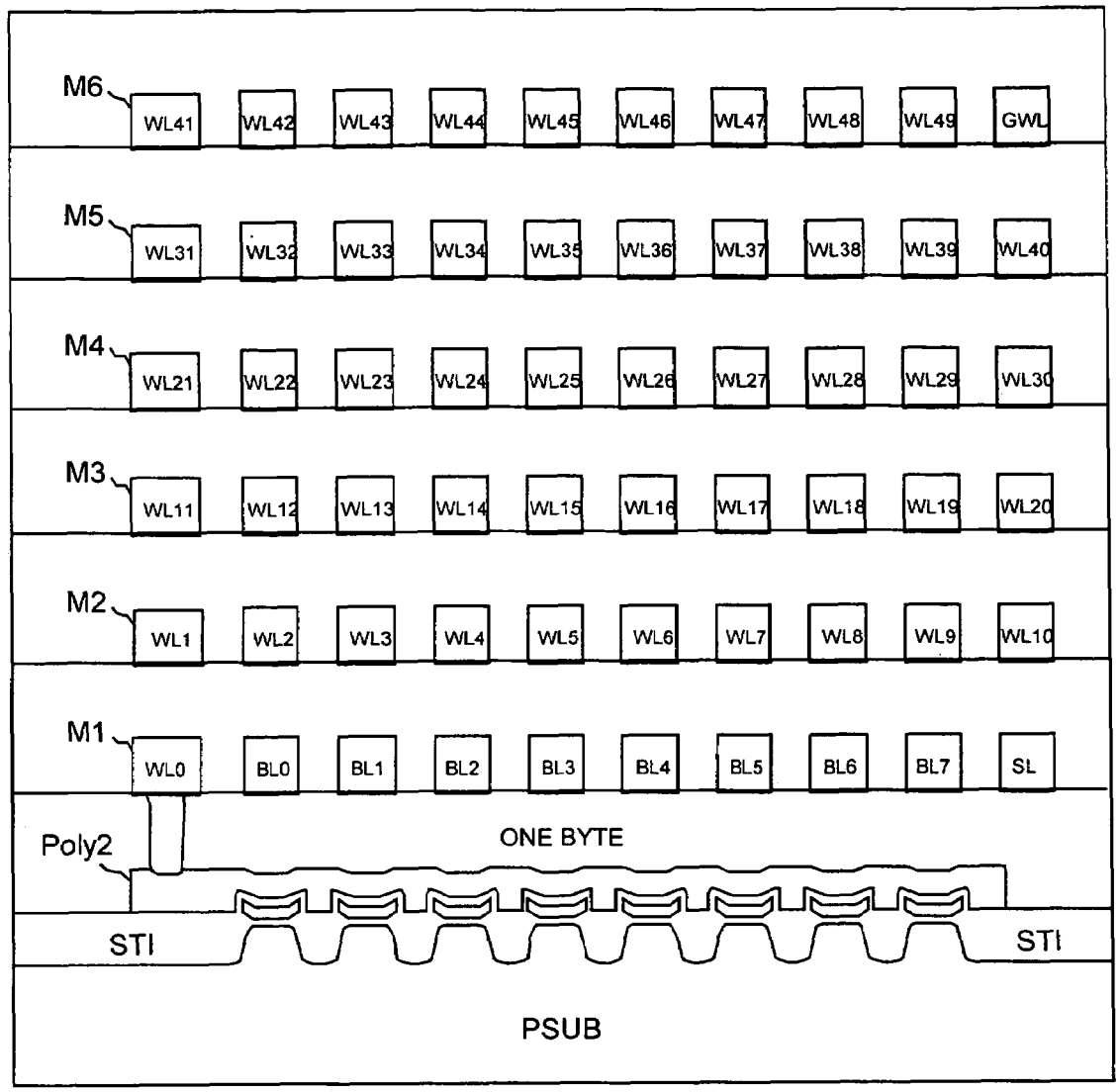
FIG. 20 is a second cross-sectional view of a byte-wide memory segment and the layers of metallization for connecting to the memory segments in a column.

In FIG. 20 is shown a second cross-sectional view of one group of metal lines of the cell array in FIGS. 16, 17 and 18 of the present invention. Six metal layers M1, M2, M3, M4, m5, and m6 are available for inter-connection. The first layer of metal (M1) is used for bit line connection BL0~BL7 and the source line SL. Five additional layers of metallization M2~M6 are used for connecting the output of the byte-word line decoder to the byte-word lines with the global word line connected on metal layer M6. Within each bit line pitch there are five metal layers that can connect the byte-word line decoder to the word lines in the memory array. Thus a total forty lines can be vertically connected to forty byte-word lines (or bytes) along the eight-bit line pitches.

In the byte-word line decoder shown in FIGS. 16, 17 and 18, a decoder signal SB0~SBk selects the decoder gate to connect a global word line signal GLW to a byte-word line which in turn selects a byte-word of data stored in a row of eight memory cells within a column and thus selected by the byte-word line from the byte-word line decoder. Each output of the byte-word line decoder in a column is interconnected to a byte-word line that is further connected to eight memory cells in that column, which contain a byte-word of data addressed by the byte-word line. For the scheme shown in FIGS. 16 and 17, a plurality of metallization layers is used to wire the interconnections between the byte-word line decoder and the word lines of the byte-words of data stored in the column. The wiring of the interconnections is within a plurality of metallization layers above the bit lines on the first layer of metallization, and the interconnection between the byte-word line decoder and the word lines of the byte-words run in parallel with the bit lines. In FIG. 18 the number of metallization layers is limited; and therefore, the wiring of the interconnections between the byte-word line decoder and the word lines of the byte-words in a plurality of columns is routed to the side of a column of byte-words to provide a sufficient number of wiring tracks and to save layout space by collecting together the areas needed to wire a the byte-words in a plurality of columns.

The previous discussion has illustrated how to connect to additional byte-decoders by running additional groups of byte-word lines. For any additional groups of ten metal line pitches (eight bit lines plus one source line and one word line on the first layer of metallization), each additional layer of metal lines can provide ten additional metal lines to connect between the byte-word line decoder and word lines of the memory array. Table 3 lists the results of connecting a number of byte-word lines to a number of metal lines in a ten-bit line pitch for a two-transistor EEPROM memory. The equation NWL=10×(N−1) is shown tabulated in Table 3, where NWL is the number of word lines, N is total the number of metal layers, and the "−1" accounts for the first layer.

The other advantage of the present invention is the layout of connecting peripheral devices is done only on Metal1. By placing interconnections below the Metal1 layer, more area is saved. FIG. 19 and FIG. 20 show cross-sectional views of metal lines for connection by using three metal layers and six metal layers, respectively. The EEPROM cells are formed on a P-substrate. The Poly2 gate of one-byte cells is connected between Poly 2 and M1, and subsequently, M1 is then connected to M2 on the next level.

TABLE 3

| Number metal layers | Number of Byte-word lines |
|---|---|
| 4 | 30 |
| 5 | 40 |
| 6 | 50 |
| N | 10 × (N − 1) |

Figure 21:
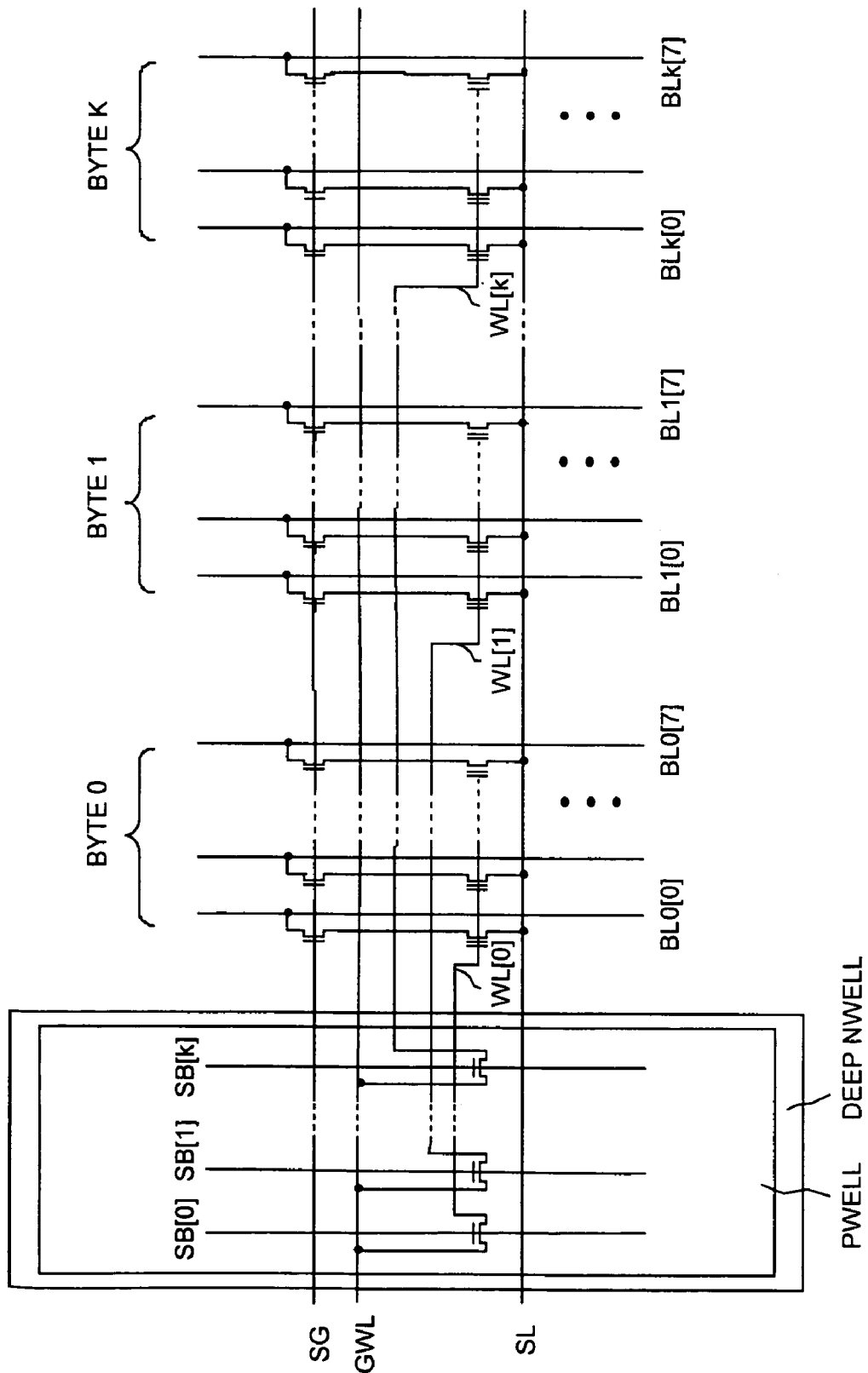
FIG. 21 is a diagram of a first layout and arrangement of byte-word line decoders connected in rows to byte segments of the two transistor cell array of the present invention.

In FIG. 21 is shown a fourth example of a preferred schematic and physical arrangement of a byte-word line decoder and a two-transistor EEPROM cell array of the present invention. In contrast to FIG. 16, the byte-word line decoder is placed on either the left or right side of the array. A plurality of byte-word line decoders is organized in one large triple well to save area. The number of outputs of each byte-decoder depends on the availability of numbers and line pitches on the metal layers. The size of each byte-decoder will be proportionally increased when the required number of outputs is increased. The use of additional metal layers will increase the number of outputs with savings in array area as density increases. In one cell pitch a plurality of metal lines of different outputs generated from each byte-decoder can be stacked together in $3^{rd}$ dimension, e.g. the z-direction, which are connected to the respective bytes of WL(k) in the x-direction of the cell array. When the number of available metal lines is limited, additional byte-decoders have to be inserted in the cell array to allow for the metal layers to connect to more byte-word lines in the x-direction. The height of each is two word line pitches. Therefore, this embodiment has less metal connection capacity as compared with the schemes disclosed in FIGS. 16, 17 and 18.

Continuing to refer to FIG. 21, the two-transistor EEPROM cells in the array are formed in the P-substrate without any triple P-well; whereas, the byte-word line decoder resides within a P-well inside an N-well. The bytes within a page are oriented horizontally in the direction of the word lines. Bit lines BL0(0)~BL7(0) connect to the first byte, Byte0, of a page. Bit lines BL1(0)~BL1(7) connect to the second byte, Byte1, of the page, and BLk(0)~BLk(7) connect to the kth byte, ByteK, of the memory page. The source line SL runs vertically in the direction of the bit lines, and the select gate line SG run horizontally across the array in the direction of the word lines. The global word line signal GLW is connected to the word lines WL(0), WL(1)~WL(k) through the decoder switches controlled by decoder signals SB(0), SB(1)~SB(k).

Figure 22:
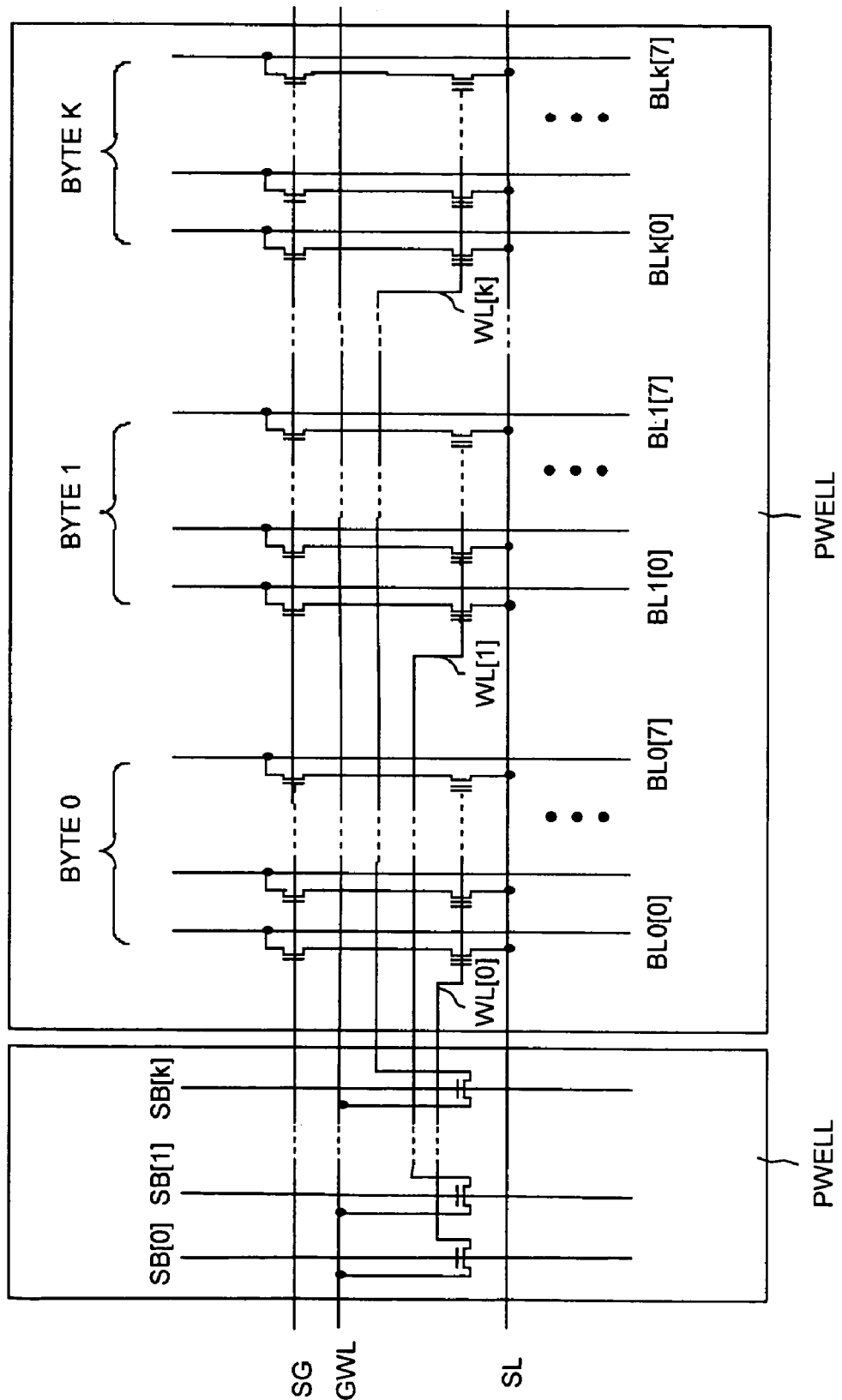
FIG. 22 is a diagram of a second layout and arrangement of byte-word line decoders connected in rows to byte segments of the two transistor cell array of the present invention.

In FIG. 22 is shown a fifth example of a preferred schematic and physical arrangement of byte-word line decoders and two-transistor EEPROM cell array similar connected to the configuration shown in FIG. 21. The EEPROM cells in the array are formed in a large triple well without well division to save array area. The byte-word line decoder is shown on the left side of the array and is located in a triple P-well. This allows the P-wells of the cell array and the byte-word line decoder to be independently biased to the required voltages. The triple P-well may be located in a large deep N-well to isolated from the P-substrate.

Figure 23:
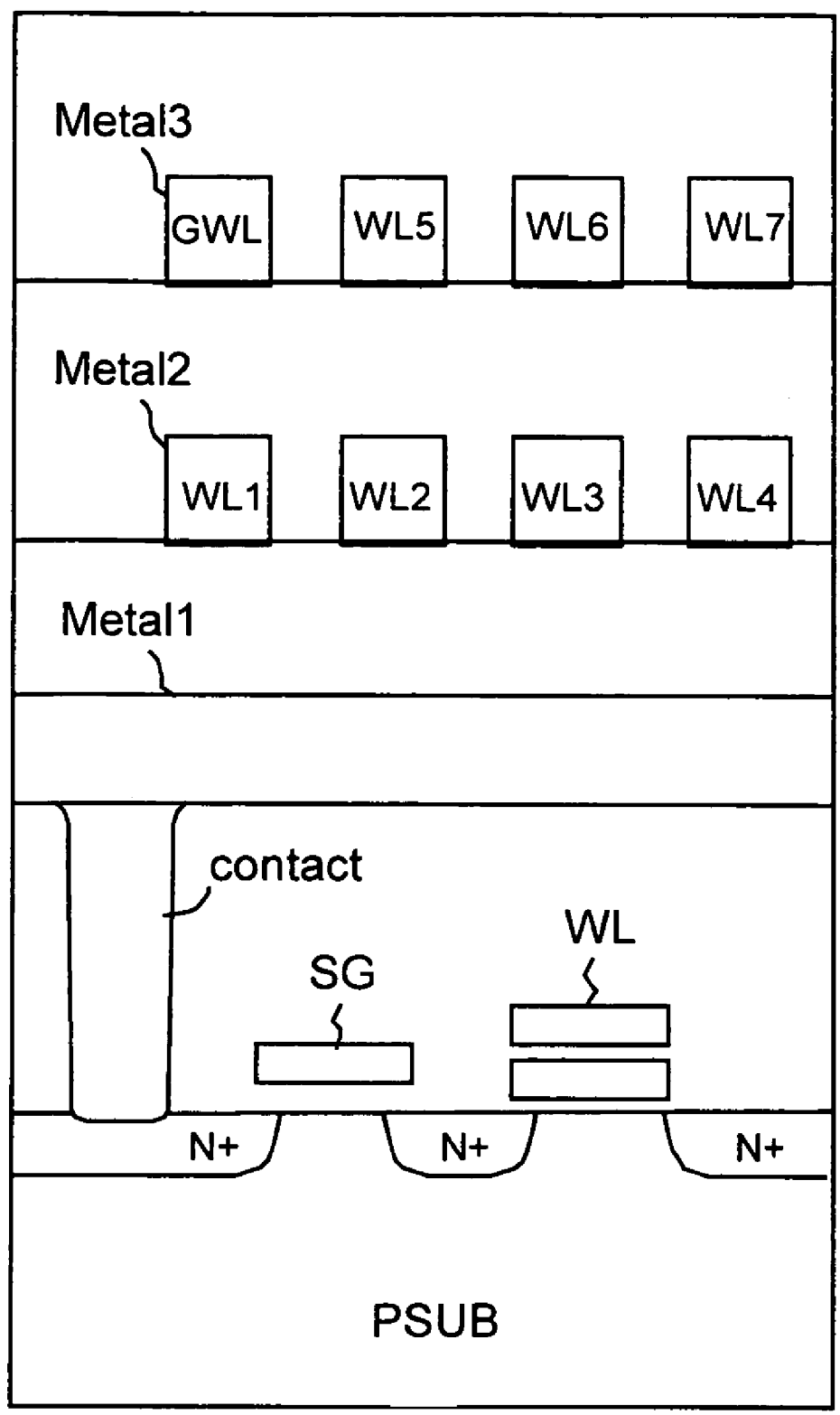
FIG. 23 is a first cross-sectional view of a byte-wide memory segment and the layers of metallization for connecting to the memory segments in a row.

FIG. 23 illustrates the cross-sectional view of one group of metal lines of the cell array in FIGS. 21 and 22 of the present invention. Three metal layers Metal1, Metal2 and Metal3 are used for inter-connection. The Metal1 (M1) is used for bit line connections in the lowest level, which run orthogonal to the word lines and the view shown in FIG. 23. Two layers of metallization, Metal2 (M2) and Metal3 (M3) are used for connecting the output of the byte-word line decoder outputs to the byte-word lines. The global word line GWL is connected to the decoder using the a metal line on M3. Each word line pitch can provide interconnections on two metal layers, thus two lines from byte-word line decoders can be connected to two byte-word lines (bytes) running horizontally in the x-direction within a word line pitch.

Continuing to refer to FIG. 23, the select gate SG of the select transistor and word line gate WL (control gate) of the storage transistor of the two-transistor EEPROM memory cell located on a P-substrate PSUB are shown with the drain of the select transistor connected by a 'contact' to the first layer of metal Metal1, which is used for bit line connections. The two additional layers of metallization, Metal2 and Metal3, are used to connect the output from the byte-word line decoder to the word lines WL1~WL7. The third layer of metallization is also used to connect the global word line GWL to the byte-word line decoder.

Figure 24:
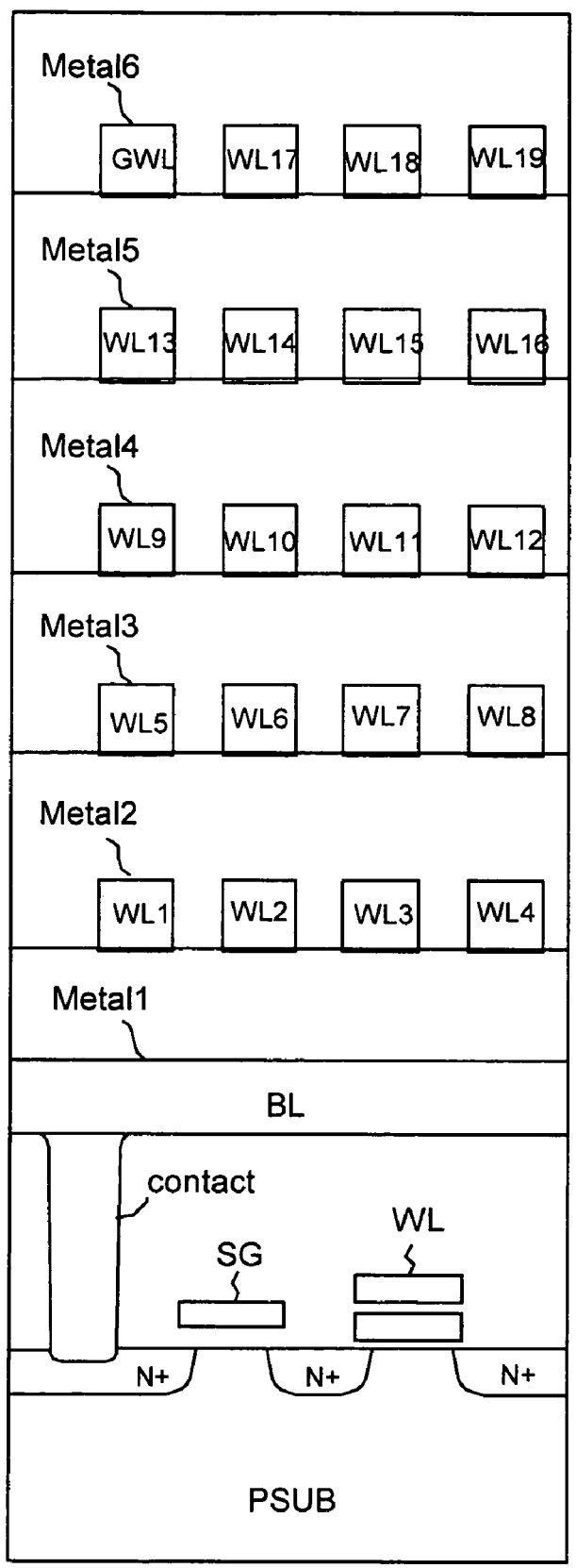
FIG. 24 is a second cross-sectional view of a byte-wide memory segment and the layers of metallization for connecting to the memory segments in a row.

FIG. 24 illustrates another cross-sectional view of one group of metal lines of the cell array in FIGS. 21 and 22 of the present invention. There are six metal layers Metal1 (M1), Metal2 (M2), Metal3 (M3), Metal4 (M4), Metal5 (M5) and Metal6 (M6) that are available for inter-connection wiring The first metal layer M1 is used for bit line connection running vertically and orthogonal to the view in FIG. 24. Five metal layers from M2 to M6 are used for connecting outputs of the byte-word line decoder to the byte-word lines. Each word line pitch has five interconnecting metal layers from M2 to M6 for word line connections. In total, twenty lines from the byte-word line decoder can be horizontally connected to twenty byte-word lines (bytes) running in the x-direction.

In the byte-word line decoder shown in FIGS. 21 and 22, a decoder signal SB0~SBk selects the decoder gate to connect a global word line signal GWL to a byte-word line which in turn selects a byte-word of data from a row of memory cells. Each output of the byte-word line decoder in a row is interconnected to a byte-word line that is connected to eight memory cells in that row, which contain a byte-word of data addressed by the byte-word line. A plurality of metallization layers is used to wire the interconnections between the byte-word line decoder and the word lines of the byte-words of data stored in the row. The wiring of the interconnections is done within a plurality of metallization layers above the first layer of metallization containing the bit lines, and orthogonal to the direction of the bit lines. Thus the wiring between the byte-word line decoder and the word lines of the byte-words run perpendicular to the direction of the bit lines located on the first layer of metallization. When the number of available metal lines is limited, additional byte decoders are inserted into the cell array to allow the metal layers to connect to more byte-word lines in a row.

The size of each byte-word line decoder will be proportionally increased when the required number of outputs is increased. The more metal layers that are available will increase the number of outputs with savings in the array area as density increases. In the height of one cell for a pitch of three word lines, the different layers of metal lines for outputs generated from each byte-decoder can be stacked together in $3^{rd}$ dimension, e.g. z-direction, and then connected to WL(0), WL(1), and WL(k), the respective byte-word lines in x-direction of a cell array. When the number of available metal lines is limited, such as in the case of an array organization with byte-word line decoders located horizontally at the end of word lines sown in FIGS. 21 and 22, additional byte-word line decoders have to be inserted in the cell array to allow metal layers to reach far-end of byte-word lines in the x-direction. This increases the array area. Table 4 shows the results of connecting a number of byte-word lines to a number of metal lines in the horizontal direction as shown in FIGS. 21 and 22.

TABLE 4

| Number metal layers | Number of Byte-word lines |
| --- | --- |
| 4 | 12 |
| 5 | 16 |
| 6 | 20 |
| N | $4 \times (N - 1)$ |

While the invention has been particularly shown and described with reference to preferred embodiments thereof, it will be understood by those skilled in the art that various changes in form and details may be made without departing from the spirit and scope of the invention.

What is claimed is:

1. An horizontal oriented EEPROM memory array, comprising:
   a) a row of two transistor EEPROM memory cells arranged into a plurality of byte-wide segments, wherein each byte-wide segment of said plurality of byte-wide segments is separately addressable,
   b) a byte-word line decoder located at an end of said row, there from said byte-word line decoder connects to a word line of each byte-wide segment in said row,
   c) an array of said byte-wide segments arranged into a plurality of rows, wherein each row contains a byte-word line decoder.

2. The memory array of claim 1, further comprising:
   a) a first plurality of metal lines connecting bit lines and a source line in columns to the memory cells in each byte-wide segment of said plurality of byte-wide segments, b) a second plurality of metal lines connecting said byte-word line decoder to said each byte wide segment contained within each row of said plurality of rows.

3. The memory array of claim 2, wherein said first plurality of metal lines are routed in columns of byte-wide segments.

4. The memory array of claim 2, wherein said second plurality of metal lines are routed in rows between said byte-word line decoder and said byte-wide segments in said row.

* * * * *